United States Patent
Yoo et al.

(10) Patent No.: US 11,450,607 B2
(45) Date of Patent: Sep. 20, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Seung Yong Yoo, Incheon (KR); Jong Jin Lee, Seoul (KE); Rak Hwan Kim, Suwon-si (KR); Eun-Ji Jung, Hwaseong-si (KR); Won Hyuk Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/892,649

(22) Filed: Jun. 4, 2020

(65) Prior Publication Data

US 2021/0090999 A1    Mar. 25, 2021

(30) Foreign Application Priority Data

Sep. 25, 2019    (KR) ........................ 10-2019-0118149

(51) Int. Cl.
*H01L 23/48* (2006.01)
*H01L 23/528* (2006.01)
(Continued)

(52) U.S. Cl.
CPC .... *H01L 23/5283* (2013.01); *H01L 21/28568* (2013.01); *H01L 21/7685* (2013.01);
(Continued)

(58) Field of Classification Search
CPC ............... H01L 23/522; H01L 23/5283; H01L 23/5226; H01L 23/53209; H01L 23/53257; H01L 21/285; H01L 21/768; H01L 21/28568; H01L 21/7685; H01L 21/76877; H01L 21/76843; H01L 21/76807; H01L 21/76816; H01L 21/76844;
(Continued)

(56) References Cited

U.S. PATENT DOCUMENTS

| 8,241,701 | B2 | 8/2012 | Dordi et al. |
| 9,620,453 | B2 | 4/2017 | Preusse et al. |
| 9,966,339 | B2 | 5/2018 | Lin et al. |
| 10,170,322 | B1 | 1/2019 | Cheng et al. |

(Continued)

FOREIGN PATENT DOCUMENTS

| KR | 10-0475529 | 3/2005 |
| KR | 10-1198937 | 11/2012 |

*Primary Examiner* — Chuong A Luu
(74) *Attorney, Agent, or Firm* — F. Chau & Associates, LLC

(57) ABSTRACT

A semiconductor device includes a first interlayer insulating film disposed on a substrate and having a first trench. A first lower conductive pattern fills the first trench and includes first and second valley areas that are spaced apart from each other in a first direction parallel to an upper surface of the substrate. The first and second valley areas are recessed toward the substrate. A second interlayer insulating film is disposed on the first interlayer insulating film and includes a second trench that exposes at least a portion of the first lower conductive pattern. An upper conductive pattern fills the second trench and includes an upper barrier film and an upper filling film disposed on the upper barrier film. The upper conductive pattern at least partially fills the first valley area.

20 Claims, 29 Drawing Sheets

(51) Int. Cl.
*H01L 21/768* (2006.01)
*H01L 23/522* (2006.01)
*H01L 23/532* (2006.01)
*H01L 21/285* (2006.01)

(52) U.S. Cl.
CPC .... *H01L 21/76877* (2013.01); *H01L 23/5226* (2013.01); *H01L 23/53209* (2013.01); *H01L 23/53238* (2013.01); *H01L 23/53257* (2013.01)

(58) Field of Classification Search
CPC ......... H01L 21/76862; H01L 21/76868; H01L 21/76849; H01L 21/76837; H01L 21/76829; H01L 21/76813; H01L 2924/01073; H01L 2924/01027; H01L 21/76802; H01L 21/76817; H01L 21/76883; H01L 21/76841; H01L 21/76876; H01L 21/76831; H01L 21/02362; H01L 23/48; H01L 23/53223; H01L 23/53238; H01L 23/53252; H01L 23/53266; H01L 2221/1073; H01L 2221/1089
USPC ......................................................... 257/751
See application file for complete search history.

(56) References Cited

U.S. PATENT DOCUMENTS

| | | |
|---|---|---|
| 10,186,456 B2 | 1/2019 | Wang et al. |
| 10,297,453 B2 | 5/2019 | Tsai et al. |
| 2010/0176511 A1* | 7/2010 | Maekawa ......... H01L 21/76814 257/751 |
| 2010/0176512 A1* | 7/2010 | Yang ................... H01L 23/5226 257/754 |
| 2017/0345738 A1* | 11/2017 | Edelstein ................ H01L 24/05 |
| 2018/0019162 A1 | 1/2018 | Ahmed et al. |
| 2018/0182856 A1* | 6/2018 | Lee ..................... H01L 23/5226 |

* cited by examiner

Fig. 24
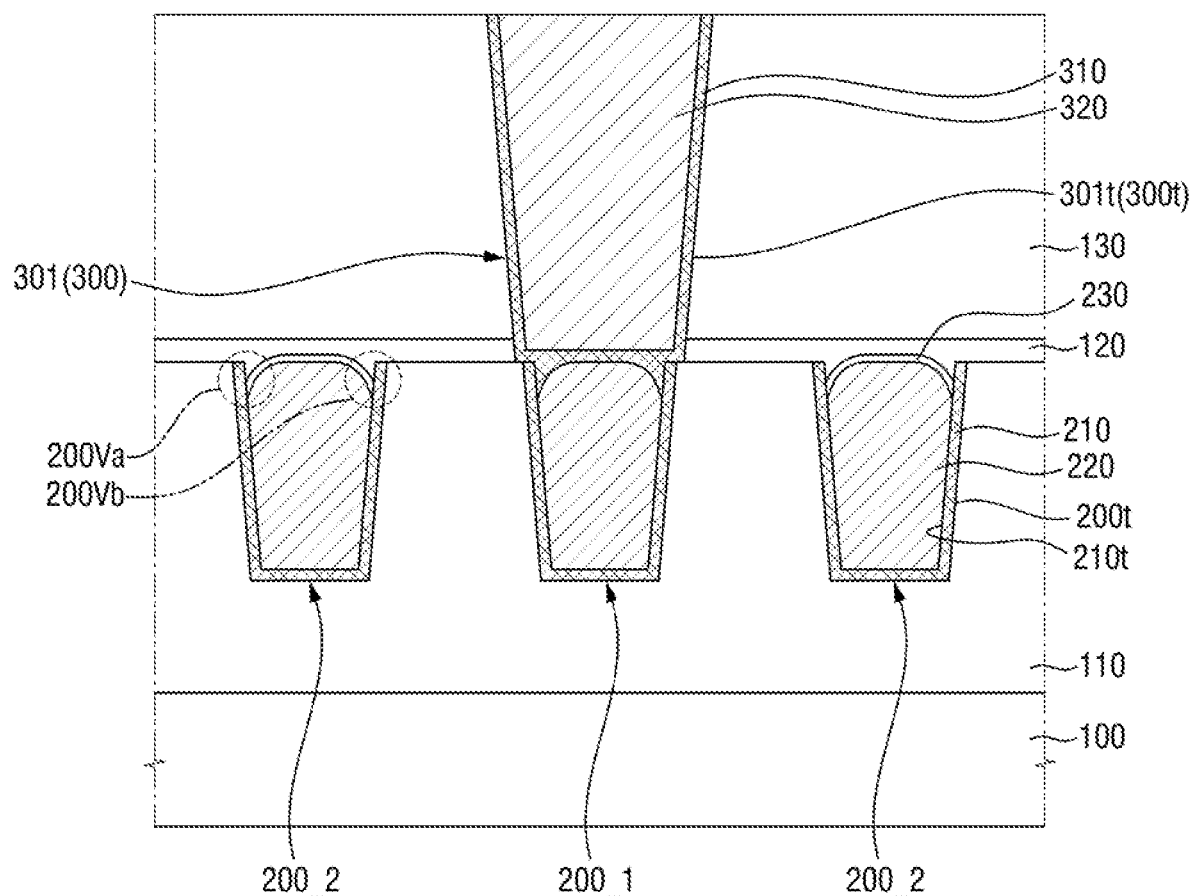
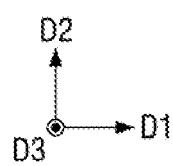

SEMICONDUCTOR DEVICE AND METHOD OF FABRICATING THE SAME

This application claims priority under 35 U.S.C. § 119 to Korean Patent Application No. 10-2019-0118149, filed on Sep. 25, 2019 in the Korean Intellectual Property Office, the disclosure of which is incorporated by reference in its entirety herein.

1. TECHNICAL FIELD

The present inventive concepts relate to a semiconductor device and a method of fabricating the same.

2. DISCUSSION OF RELATED ART

Semiconductor chips having a high integration density and a low power consumption have attracted increased attention in view of advancements in the technology for electronic devices and a recent trend for down-scaling of electronic devices. Therefore, the feature size of semiconductor devices has continued to decrease to meet these requirements.

As the feature size of semiconductor devices has decreased, various research has been conducted on ways to stably connect wires.

SUMMARY

Exemplary embodiments of the present inventive concepts provide a semiconductor device that improves performance and reliability.

Exemplary embodiments of the present inventive concepts also provide a method of fabricating a semiconductor device that improves performance and reliability.

However, exemplary embodiments of the present inventive concepts are not restricted to those set forth herein. The above and other exemplary embodiments of the present inventive concepts will become more apparent to one of ordinary skill in the art to which the present disclosure pertains by referencing the detailed description of the present disclosure given below.

According to an exemplary embodiment of the present inventive concepts, a semiconductor device includes a first interlayer insulating film disposed on a substrate and having a first trench. A first lower conductive pattern fills the first trench and includes first and second valley areas that are spaced apart from each other in a first direction parallel to an upper surface of the substrate. The first and second valley areas are recessed toward the substrate. A second interlayer insulating film is disposed on the first interlayer insulating film and includes a second trench that exposes at least a portion of the first lower conductive pattern. An upper conductive pattern fills the second trench and includes an upper barrier film and an upper filling film disposed on the upper barrier film. The upper conductive pattern at least partially fills the first valley area.

According to an exemplary embodiment of the present inventive concepts, a semiconductor device includes a lower conductive pattern including a lower barrier film that defines a filling film trench, and a lower filling film disposed on the lower barrier film in the filling film trench. The lower conductive pattern has a top surface that has a first width in a first direction that is parallel to an upper surface of a substrate. An upper conductive pattern is disposed on the lower conductive pattern. The upper conductive pattern is connected to the lower conductive pattern and includes an upper barrier film and an upper filling film that is disposed on the upper barrier film. A bottom surface of the upper conductive pattern has a second width in the first direction. The second width is greater than or equal to the first width. The upper barrier film covers portions of the lower barrier film that define sidewalls of the filling film trench.

According to the aforementioned and other exemplary embodiments of the present inventive concepts, a semiconductor device a semiconductor device includes a first interlayer insulating film disposed on a substrate and including a first trench. A lower conductive pattern is disposed in the first trench and includes a lower barrier film. A lower liner is disposed on the lower barrier film. A lower filling film is disposed on the lower liner. A second interlayer insulating film is disposed on the first interlayer insulating film and includes a second trench that exposes at least a portion of a top surface of the lower conductive pattern. An upper conductive pattern fills the second trench and includes an upper barrier film and an upper filling film disposed on the upper barrier film. The lower conductive pattern further includes valley areas that are defined by the lower barrier film, the lower liner, and the lower filling film and extend in a thickness direction of the substrate. The upper conductive pattern fills the valley areas.

According to the aforementioned and other exemplary embodiments of the present inventive concepts, a method of fabricating a semiconductor device includes forming a lower conductive pattern in a first interlayer insulating film, the lower conductive pattern including valley areas that extend in a thickness direction of the first interlayer insulating film. A second interlayer insulating film is formed on the first interlayer insulating film, the second interlayer insulating film including a trench that exposes at least a partial portion of a top surface of the lower conductive pattern. An upper barrier film is formed along sidewalls of the trench and surfaces of the valley areas. An upper filling film is formed on the upper barrier film.

Other features and embodiments may be apparent from the following detailed description, the drawings, and the claims.

BRIEF DESCRIPTION OF THE DRAWINGS

The above and other embodiments and features of the present disclosure will become more apparent by describing in detail exemplary embodiments thereof with reference to the attached drawings, in which:

FIG. 24 is a cross-sectional view of a semiconductor device according to an exemplary embodiment of the present inventive concepts.

DETAILED DESCRIPTION OF EXEMPLARY EMBODIMENTS

Figure 1:
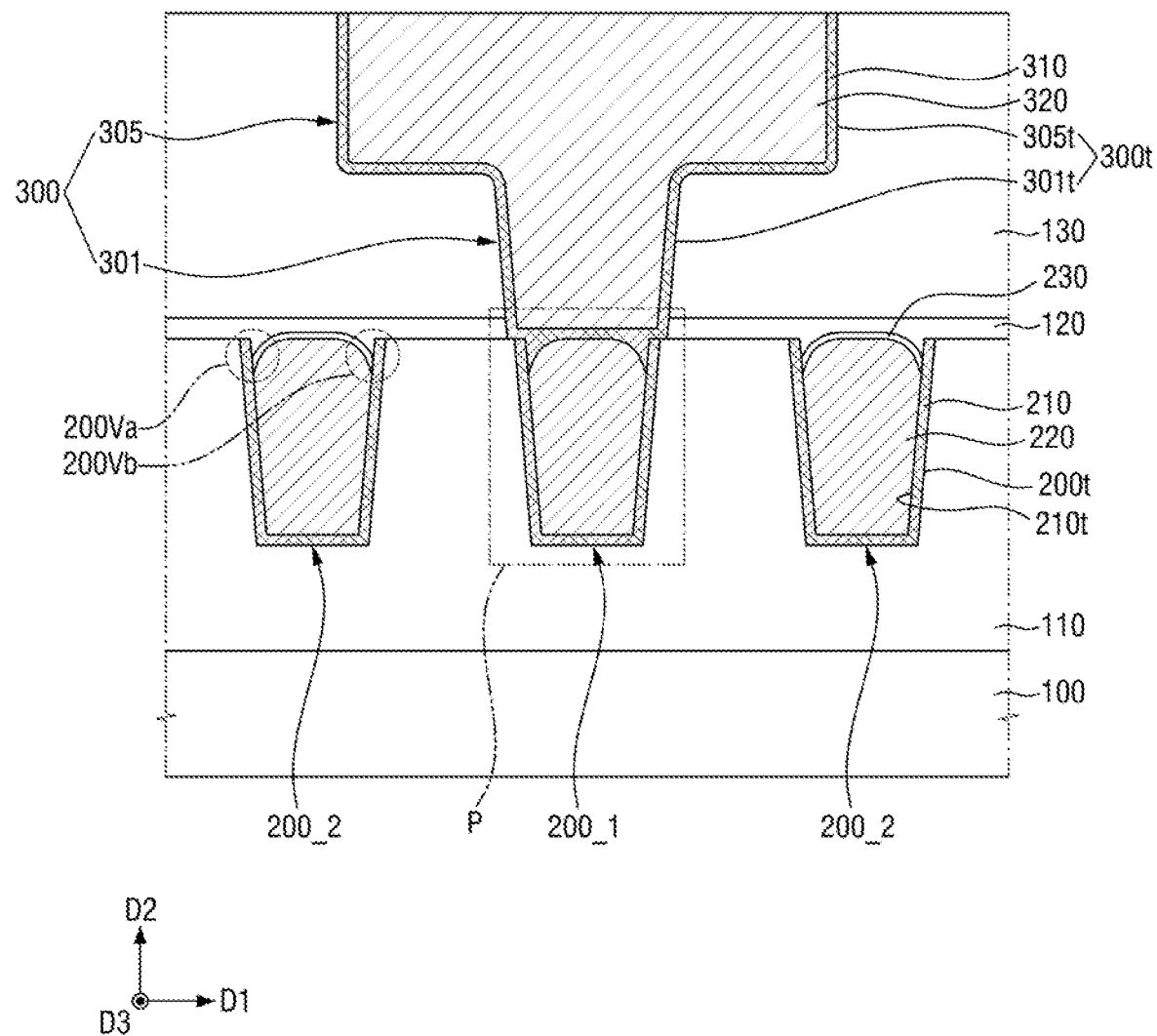
FIG. 1 is a cross-sectional view of a semiconductor device according to an exemplary embodiment of the present inventive concepts.
Figure 2:
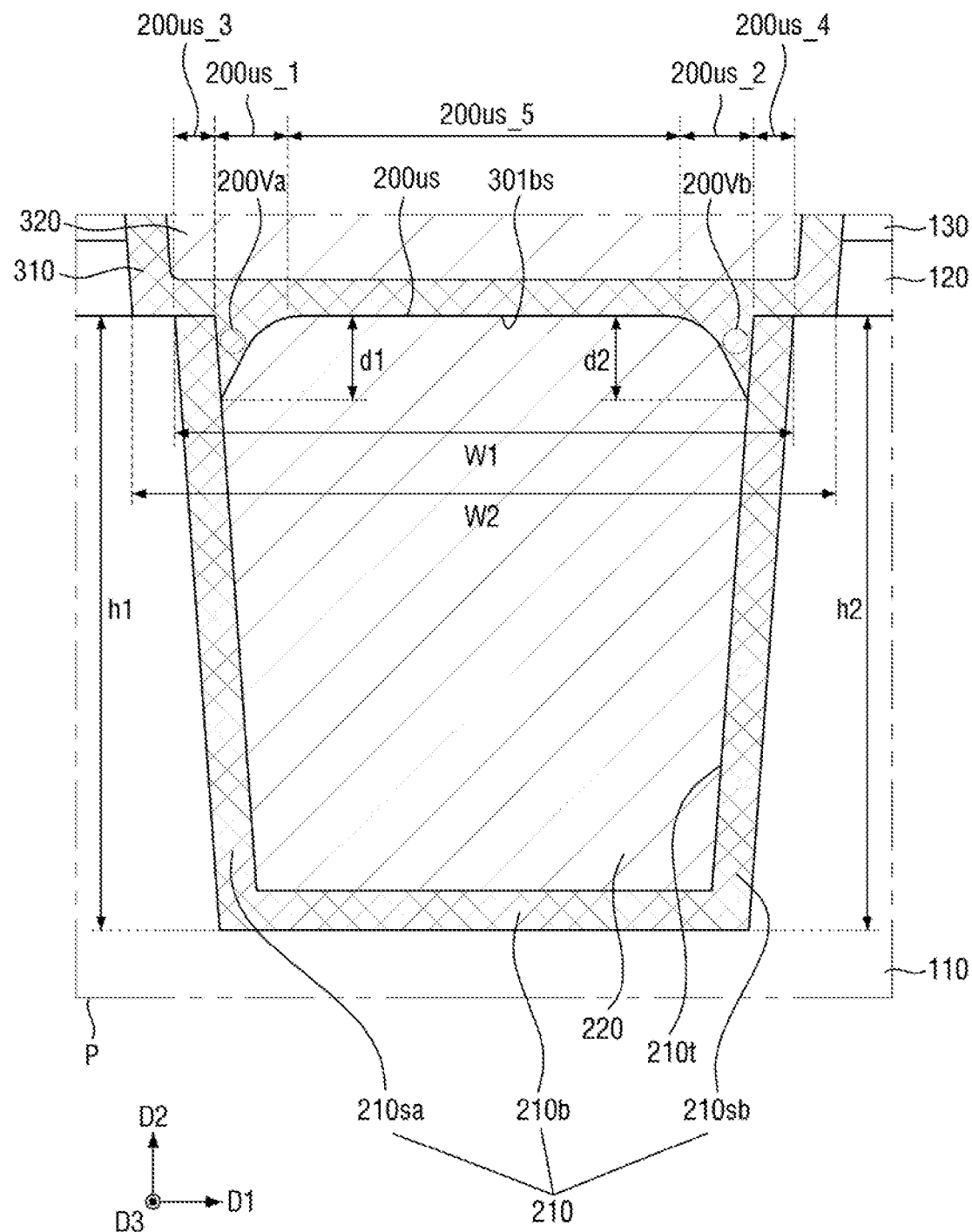
FIG. 2 is an enlarged cross-sectional view of portion P of the semiconductor device of FIG. 1 according to an exemplary embodiment of the present inventive concepts.

FIG. 1 is a cross-sectional view of a semiconductor device according to an exemplary embodiment of the present inventive concepts. FIG. 2 is an enlarged cross-sectional view of portion P of the semiconductor device of FIG. 1 according to an exemplary embodiment of the present inventive concepts.

Referring to FIGS. 1 and 2, the semiconductor device may include a first lower conductive pattern 200_1, second lower conductive patterns 200_2, and an upper conductive pattern 300.

The semiconductor device includes a substrate 100. In an exemplary embodiment, the substrate 100 may be a bulk silicon substrate or a silicon-on-insulator (SOI) substrate. In another exemplary embodiment, the substrate 100 may be a silicon substrate or may include at least one material selected from silicon germanium, silicon germanium-on-insulator (SGOI), indium antimonide, a lead tellurium compound, indium arsenide, indium phosphide, gallium arsenide, or gallium antimonide. However, exemplary embodiments of the present inventive concepts are not limited thereto.

The substrate 100 may also include conductive patterns. In an exemplary embodiment, the conductive patterns may be metal wires, contacts, conductive pads, the gate electrodes and the sources/drains of transistors, or diodes. However, exemplary embodiments of the present inventive concepts are not limited thereto. For example, the substrate 100 may include transistors formed in a front-end-of-line (FEOL) process or contacts or contact wires formed in a middle-of-line process. Also, the substrate 100 may include connecting wires formed in a back-end-of-line (BEOL) process.

A lower interlayer insulating film 110 may be disposed on the substrate 100 (e.g., in a second direction D2 that is a direction of the thickness of the substrate 100). For example, as shown in the exemplary embodiment of FIG. 1, a lower surface of the lower interlayer insulating film 110 may directly contact an upper surface of the substrate 100. The lower interlayer insulating film 110 may include at least one lower pattern trenches 200t.

In an exemplary embodiment, the lower interlayer insulating film 110 may include at least one compound selected from silicon oxide, silicon nitride, silicon oxynitride, and a low-k material. For example, the lower interlayer insulating film 110 may include a low-k material to reduce the occurrence of a coupling phenomenon between adjacent conductive patterns. The low-k material may be a material having sufficient amounts of carbon and hydrogen such as, for example, SiCOH.

Since carbon is contained in the low-k material, the dielectric constant of the low-k material can be further reduced. In an exemplary embodiment, the low-k material may include pores or cavities filled with a gas or the air to further reduce the dielectric constant of the low-k material.

In an exemplary embodiment, the low-k material may include at least one compound selected from fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexaethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon-doped silicon oxide (CDO), organo silicate glass (OSG), SiLK, amorphous fluorinated carbon, silica aerogels, silica xerogels, mesoporous silica, or a combination thereof. However, exemplary embodiments of the present inventive concepts are not limited thereto.

The first lower conductive pattern 200_1 and the second lower conductive patterns 200_2 may be disposed on the substrate 100 and may be spaced apart from each other in a first direction D1 that is parallel to an upper surface of the substrate 100 and crosses the second direction D2. The first lower conductive pattern 200_1 and the second lower conductive patterns 200_2 may be disposed in the lower interlayer insulating film 110.

The first lower conductive pattern 200_1 and the second lower conductive patterns 200_2 may fill the lower pattern trenches 200t.

The first lower conductive pattern 200_1 may be connected to the upper conductive pattern 300. As shown in the exemplary embodiment of FIG. 1, the second lower conductive patterns 200_2 may not be connected to the upper conductive pattern 300. However, exemplary embodiments of the present inventive concepts are not limited thereto. For example, in another exemplary embodiment, at least one second lower conductive pattern 200_2 may be connected to a conductive pattern in the upper interlayer insulating film 130 that is spaced apart from the upper conductive pattern 300 in a third direction D3 that is parallel to an upper surface of the substrate and crosses the first direction D1 and the second direction D2.

The first lower conductive pattern 200_1 and the second lower conductive patterns 200_2 may each include a lower barrier film 210 and a lower filling film 220. The lower filling film 220 may be disposed on the lower barrier film 210.

The lower barrier film 210 may extend along the sidewalls and the bottom of each of the lower pattern trenches 200t. The lower barrier film 210 may define filling film trenches 210t in the lower pattern trenches 200t.

The lower filling film 220 may fill the lower pattern trenches 200t in which the lower barrier film 210 is formed. The lower filling film 220 may at least partially fill the filling film trenches 210t.

As shown in the exemplary embodiment of FIG. 1, the second lower conductive patterns 200_2 may further include a capping film 230 disposed on an upper surface of the lower filing film 220 (e.g., in the second direction D2). In an exemplary embodiment, the first lower conductive pattern 200_1 may not include the capping film 230 in a portion thereof that is connected to the upper conductive pattern 300. However, the first lower conductive pattern 200_1 may include the capping film 230 in a portion thereof that is not connected to the upper conductive pattern 300. While the exemplary embodiment shown in FIG. 1 shows the capping film 230 as being formed on upper surfaces of the lower filling film 220 in each of the second lower conductive patterns 200_2, exemplary embodiments of the present inventive concepts are not limited thereto. For example, in another exemplary embodiment, the capping film 230 may also be formed on at least one sidewall and/or the bottom surface of the lower barrier film 210 in each of the second lower conductive patterns 200_2.

In an exemplary embodiment, the lower barrier film 210 may include at least one compound selected from tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), and rhodium (Rh). However, exemplary embodiments of the present inventive concepts are not limited thereto. For example, the lower barrier film 210 may include Ta.

The lower filling film 220 may include at least one compound selected from aluminum (A), Cu, W, and Co. However, exemplary embodiments of the present inventive concept are not limited thereto. In an embodiment in which the lower filling film 220 includes Cu, the lower filling film 220 may further include at least one compound selected from carbon (C), Ag, Co, Ta, indium (In), tin (Sn), zinc (Zn), manganese (Mn), titanium (Ti), magnesium (Mg), chromium (Cr), germanium (Ge), strontium (Sr), platinum (Pt), Al, and Zr.

In an exemplary embodiment, the capping film 230 may include at least one of Co, Ru, and Mn. However, exemplary embodiments of the present inventive concept are not limited thereto.

The shape of the first lower conductive pattern 200_1 will hereinafter be described with reference to FIG. 2. The shape of the second lower conductive patterns 200_2 is substantially the same as the shape of the first lower conductive pattern 200_1, and thus, a detailed description thereof will be omitted.

Referring to FIG. 2, the first lower conductive pattern 200_1 may include first and second valley areas 200Va and 200Vb. The first and second valley areas 200Va and 200Vb may be spaced apart from each other in the first direction D1.

The first and second valley areas 200Va and 200Vb may be areas that are recessed toward the substrate 100. The first and second valley areas 200Va and 200Vb may be recessed areas formed in the first lower conductive pattern 200_1 and may have a recessed shape.

The first and second valley areas 200Va and 200Vb may be formed on a top surface 200us of the first lower conductive pattern 200_1, such as the top surface of the lower filling film 220. For example, the first and second valley areas 200Va and 200Vb may extend in the thickness direction of the lower interlayer insulating film 110 (e.g., in the second direction D2). The first and second valley areas 200Va and 200Vb may be recessed areas that extend in the second direction D2.

The lower barrier film 210 may include a bottom portion 210b, which extends along the bottom of the lower pattern trench 200t (e.g., substantially in the first direction D1) and corresponding to the first lower conductive pattern 200_1, and first and second sidewall portions 210sa, 210sb which extend along the sidewalls of the lower pattern trench 200t corresponding to the first lower conductive pattern 200_1 and are spaced apart from each other in the first direction D1. The first and second sidewall portions 210sa, 210sb may extend substantially in the second direction D2 along the sidewalls of the lower pattern trench 200t corresponding to the first lower conductive pattern 200_1.

The first and second sidewall portions 210sa and 210sb extend from the bottom portion 210b. The filling film trench 210t corresponding to the first lower conductive pattern 200_1 may be defined by the first and second sidewall portions 210sa and 210sb and the bottom portion 210b.

As shown in the exemplary embodiment of FIG. 2, the top surface of the lower filling film 220 may be upwardly convex (e.g., in the second direction D2). As a result, a height (e.g., distance from an upper surface of the substrate 110 in the second direction D2) of lateral edge portions of the top surface of the lower filling film 220 (e.g., lateral edges in the first direction D1) may be lower than upper portions of the first and second sidewall portions 210sa and 210sb of the lower barrier film 210. For example, as shown in the exemplary embodiment of FIG. 2, the lateral edge portions of the lower filling film 220 may not cover upper portions of the first and second sidewall portions 210sa and 210sb of the lower barrier film 210 that define the sidewalls of the filling film trench 210t corresponding to the first lower conductive pattern 200_1.

The first and second valley areas 200Va and 200Vb may be defined by the height differences between the lateral edge portions of the top surface of the lower barrier film 210 and the upper portions of the lower filling film 220. The first and second valley areas 200Va and 200Vb may be the area between the top surface of the lower filling film 220 and the first and second sidewall portions of the lower barrier film 210 that are not covered by the lower filling film 220.

For example, as shown in an exemplary embodiment of FIG. 2, the first and second valley areas 200Va and 200Vb may have a generally triangular cross-sectional shape. However, in other exemplary embodiments, the top surface of the lower filling film 220 may have other shapes aside from the upwardly convex shape shown in the exemplary embodiments of FIGS. 1-2, and the recess areas forming the first and second valley areas 200Va, 200Vb may have various different shapes defined by the lower filling film 200 and the lower barrier film 210.

The first lower conductive pattern 200l may include the top surface 200us, which is curved (e.g., upwardly convex in the second direction D2). For example, the top surface 200us of the first lower conductive pattern 200_1 may include a first valley portion 200us_1, a second valley portion 200us_2, a first protruding portion 200us_3, a second protruding portion 200us_4, and a valley connecting portion 200us_5, which connects the first and second valley portions 200us_1 and 200us_2.

The first protruding portion 200us_3 may include the top surface of the first sidewall portion 210sa of the lower barrier film 210, and the second protruding portion 200us_4 may include the top surface of the second sidewall portion 210sb of the lower barrier film 210. The first valley portion 200us_1 may include a lateral edge of the top surface of the lower filling film 220 (e.g., the left lateral edge) and the portion of the adjacent first sidewall portion 210sa of the lower barrier film 210 that is not covered by the lower filling film 220. The second valley portion 200us_2 may include the other lateral edge (e.g., the right lateral edge) of the top surface of the lower filling film 220 and the portion of the adjacent second sidewall portion 210sb of the lower barrier film 210 that is not covered by the lower filling film 220. The valley connecting portion 200us_5 may include the top surface of the lower filling film 220 which extends between the first valley portion 200us_l and the second valley portion 200us_2 (e.g., in the first direction D1). In an exemplary embodiment, the valley connecting portion 200us_5 may be substantially flat. However, exemplary embodiments of the present inventive concepts are not limited thereto.

The first and second valley portions 200us_l and 200us_2 may be defined by the lower filling film 220 and the upper portions of the first and second sidewall portions 210sa and 210sb of the lower barrier film 210 that are not covered by the lower filling film 220. The valley connecting portion 200us_5 may be defined by an upper portion of the lower filling film 220 extending between the first and second valley portions 200us_1, 200us_2 (e.g., in the first direction D1).

The first valley area 200Va may be defined by the first valley portion 200us_1 of the top surface 200us of the first lower conductive pattern 200_1. The second valley area 200Vb may be defined by the second valley portion 200us_2 of the top surface 200us of the first lower conductive pattern 200_1.

For example, an upper surface of the first valley area 200Va may extend (e.g., in the first direction D1) between an uppermost portion (e.g., in the second direction D2) of the first sidewall portion 210sa of the lower barrier film 210, which defines the filling film trench 210t corresponding to the first lower conductive pattern 200_1 and an uppermost portion (e.g., in the second direction D2) of the lower filling film 220. The bottom of the first valley area 200Va may correspond to an area where the lower portion of the first sidewall portion 210sa of the lower barrier film 210 and the lateral edge of the top surface of the lower filling film 220 meet.

The first valley area 200Va may have a first depth d1 (e.g., length in the second direction D2) with respect to the top surface of the first lower conductive pattern 200_1 (e.g., the uppermost portion of the lower filling film 220), and the second valley area 200Vb may have a second depth with respect to the uppermost part of the lower filling film 220. As shown in the exemplary embodiment of FIG. 2, the first depth d1 may be the same as the second depth d2. However, in other exemplary embodiments of the present inventive concepts the first depth d1 and the second depth d2 may be different from each other.

The first sidewall portion 210sa of the lower barrier film 210 may have a first height h1 (e.g., length in the second direction D2) with respect to the bottom of the lower pattern trench 200t corresponding to the first lower conductive pattern 200l, and the second sidewall portion 210sb of the lower barrier film 210 may have a second height h2 (e.g., length in the second direction D2) with respect to the bottom of the lower pattern trench 200t corresponding to the first lower conductive pattern 200_1. As shown in the exemplary embodiment of FIG. 2, the first height h1 may be the same as the second height h2. However, exemplary embodiments of the present inventive concepts are not limited thereto.

The second lower conductive patterns 200_2, like the first lower conductive pattern 200_1, may each include first and second valley areas 200Va and 200Vb that are spaced apart from each other in the first direction D1. The depth (e.g., length from a top surface to a bottom surface in the second direction D2) of the first valley areas 200Va of the second lower conductive patterns 200_2 may be the same as, or different from, the depth of the second valley areas 200Vb of the second lower conductive patterns 200_2.

An etching stopper film 120 may be disposed on the lower interlayer insulating film 110. The etching stopper film 120 may cover the top surface of the lower interlayer insulating film 110 and the top surfaces of the second lower conductive patterns 200_2. For example, as shown in the exemplary embodiment of FIG. 1, a lower surface of the etching stopper film 120 may directly contact upper surfaces of the capping film 230 of the second lower conductive patterns 200_2 and the lower interlayer insulating film 110.

In an exemplary embodiment, the etching stopper film 120 may include, for example, a silicon-based insulating material. The etching stopper film 120 may include a silicon-based insulating material film. For example, the etching stopper film 120 may include at least one compound selected from silicon nitride (SiN), silicon carbonitride (SiCN), silicon boron nitride (SiBN), silicon carbonate (SiCO), silicon oxynitride (SiON), silicon oxide (SiO), and silicon oxycarbonitride (SiOCN). However, exemplary embodiments of the present inventive concepts are not limited thereto. In the present Specification, the term "silicon oxycarbonitride" simply means that the corresponding material contains silicon (Si), carbon (C), and oxygen (O), but does not necessarily mean any specific ratio of Si, C, and O in the corresponding material.

The first valley areas 200Va and/or the second valley areas 200Vb of the second lower conductive patterns 200_2 may be filled with an insulating material.

For example, as shown in the exemplary embodiment of FIGS. 1-2, both of the first valley areas 200Va and the second valley areas 200Vb of the second lower conductive patterns 200_2 are filled with an insulating material. The etching stopper film 120 may fill the first valley areas 200Va and the second valley areas 200Vb of the second lower conductive patterns 2002. However, exemplary embodiments of the present inventive concepts are not limited thereto.

The upper interlayer insulating film 130 may be disposed on the etching stopper film 120. For example, as shown in the exemplary embodiment of FIGS. 1-2 a lower portion of the upper interlayer insulating film 130 may directly contact an upper portion of the etching stopper film 120. The upper interlayer insulating film 130 may include an upper pattern trench 300t. The upper pattern trench 300t may extend into the etching stopper film 120. For example, as shown in the exemplary embodiment of FIG. 1, the upper pattern trench 300t may extend through the etching stopper film 120.

The upper pattern trench 300t may expose at least part of the first lower conductive pattern 200_1. The upper pattern trench 300t may include a first upper via trench 301t and an upper wire trench 305t. At least a partial portion of the first lower conductive pattern 200_1 may be exposed by the first upper via trench 301t.

In an exemplary embodiment, the upper interlayer insulating film 130 may include at least one compound selected from silicon oxide, silicon nitride, silicon oxynitride, and a low-k material. However, exemplary embodiments of the present inventive concepts are not limited thereto.

The upper conductive pattern 300 may be disposed in the upper interlayer insulating film 130. As shown in the exemplary embodiment of FIG. 1, the upper conductive pattern 300 may fill the upper pattern trench 300t. The upper conductive pattern 300 may be connected to the first lower conductive pattern 200_1.

The upper conductive pattern 300 may include an upper barrier film 310 and an upper filling film 320. The upper filling film 320 may be disposed on the upper barrier film 310.

The upper barrier film 310 may extend along the sidewalls and the bottom of the upper pattern trench 300t. The upper barrier film 310 may extend along the sidewalls of the first upper via trench 301t and along the sidewalls and the bottom of the upper wire trench 305t. A portion of the upper barrier film 310 may extend along the top surface 200us of the first lower conductive pattern 200_1. The upper filling film 320 may fill the upper patter trench 300t in which the upper barrier film 310 is formed.

The upper conductive pattern 300 may include a first upper via 301, which fills the upper via trench 301t, and an upper connecting wire 305, which fills the upper wire trench 305t.

In an exemplary embodiment, the upper barrier film 310 may include at least one compound selected from Ta, TaN, Ti, TiN, Ru, Co, Ni, NiB, W, WN, WCN, Zr, ZrN, V, VN, Nb, NbN, Pt, Ir, and Rh. However, exemplary embodiments of the present inventive concepts are not limited thereto.

In an exemplary embodiment, the upper filling film 320 may include at least one compound selected from Al, Cu, W, and Co. However, exemplary embodiments of the present inventive concepts are not limited thereto.

In the exemplary embodiment shown in FIG. 1, the capping film 230 is not formed on the upper filling film 320. However, exemplary embodiments of the present inventive concepts are not limited thereto. Additionally, in the exemplary embodiment shown in FIG. 1, there are no valley areas formed between the upper filling film 320 and the upper barrier film 310. However, exemplary embodiments of the present inventive concepts are not limited thereto. For example, in an alternative embodiment, the upper conductive pattern 300, like the first lower conductive pattern 200_1 and the second lower conductive patterns 200_2, may include at least one valley area.

In the exemplary embodiment shown in FIG. 1, the upper filling film 320, which is included in the first upper via 301, and the upper filling film 320, which is included in the upper connecting wire 305, are directly connected to each other. However, exemplary embodiments of the present inventive concepts are not limited thereto. For example, in another exemplary embodiment, the upper barrier film 310 may be disposed between the upper filling film 320, which is included in the first upper via 301, and the upper filling film 320, which is included in the upper connecting wire 305.

The upper conductive pattern 300 may fill at least one of the first and second valley areas 200Va and 200Vb of the first lower conductive pattern 200_1. For example, as shown in the exemplary embodiment of FIGS. 1-2, the upper conductive pattern 300 may fill both of the first and second valley areas 200Va and 200Vb of the first lower conductive pattern 200_1.

In an exemplary embodiment, the upper barrier film 310 may entirely fill at least one of the first and second valley areas 200Va and 200Vb of the first lower conductive pattern 2001. For example, as shown in the exemplary embodiment of FIGS. 1-2, the upper barrier film 310 may entirely fill both of the first and second valley areas 200Va and 200Vb of the first lower conductive pattern 200_1.

In the present Specification, the expression "one element entirely filling the other element" means that one element entirely fills the other element in a cross-sectional view (e.g., when viewed from the third direction D3).

Since the upper barrier film 310 entirely fills the first and second valley areas 200Va and 200Vb of the first lower conductive pattern 2001, a lowermost portion of the upper filling film 320, which is disposed on the upper barrier film 310, may be higher (e.g., distance from an upper surface of the substrate 100 in the second direction D2) than the uppermost portions of the first and second sidewall portions 210sa and 210sb of the lower barrier film 210. For example, the upper barrier film 310 may be disposed between the lowermost portion of the upper filling film 320 and the uppermost portion of the first and second sidewall portions 210sa, 210sb of the lower barrier film 210 in the second direction D2).

The upper conductive pattern 300 may cover the upper portions of the first and second sidewall portions 210sa and 210sb of the lower barrier film 210 that define the sidewalls of the filling film trench 210t corresponding to the first lower conductive pattern 200_1. For example, the upper barrier film 310 may cover the portions of the first and second sidewall portions 210sa and 210sb of the lower barrier film 210 that define the sidewalls of the filling film trench 210t corresponding to the first lower conductive pattern 200_1.

The first and second valley areas 200Va and 200Vb of the first lower conductive pattern 200_1 may be defined by the top surface of the lower filling film 220 and the upper portions of the first and second sidewall portions 210sa and 210sb of the lower barrier film 210 that are not covered by the lower filling film 220. As shown in the exemplary embodiments of FIGS. 1-2, the upper barrier film 310 may cover the first and second valley areas 200Va, 200Vb. The first and second valley portions 200us_1 and 200us_2 of the top surface 200us of the first lower conductive pattern 200_1 may be defined by the top surface of the lower filling film 220 and the portions of the first and second sidewall portions 210sa and 210sb of the lower barrier film 210 that are covered by the upper barrier film 310. The first and second valley areas 200Va and 200Vb of the first lower conductive pattern 200_1 may include the lateral edges of the top surface of the lower filling film 220 and the upper portions of the first and second sidewall portions 210sa and 210sb of the lower barrier film 210 that are covered by the upper barrier film 310.

The bottom surface of the upper conductive pattern 300 may be a bottom surface 301bs of the first upper via 301 and portions of the upper barrier film 310 extending within first and second valley areas 200Va, 200Vb. As shown in the exemplary embodiment of FIG. 2, a width W1 (e.g., length in the first direction D1) of the top surface 200us of the first lower conductive pattern 200_1 may be less than a width W2 (e.g., length in the first direction D1) of the bottom surface 301bs of the upper conductive pattern 300.

As shown in the exemplary embodiment of FIG. 1, in a cross-sectional view, the bottom surface 301bs of the upper conductive pattern 300 may entirely cover the top surface 200us of the first lower conductive pattern 200_1 (e.g., in the first direction D1).

Figure 3:
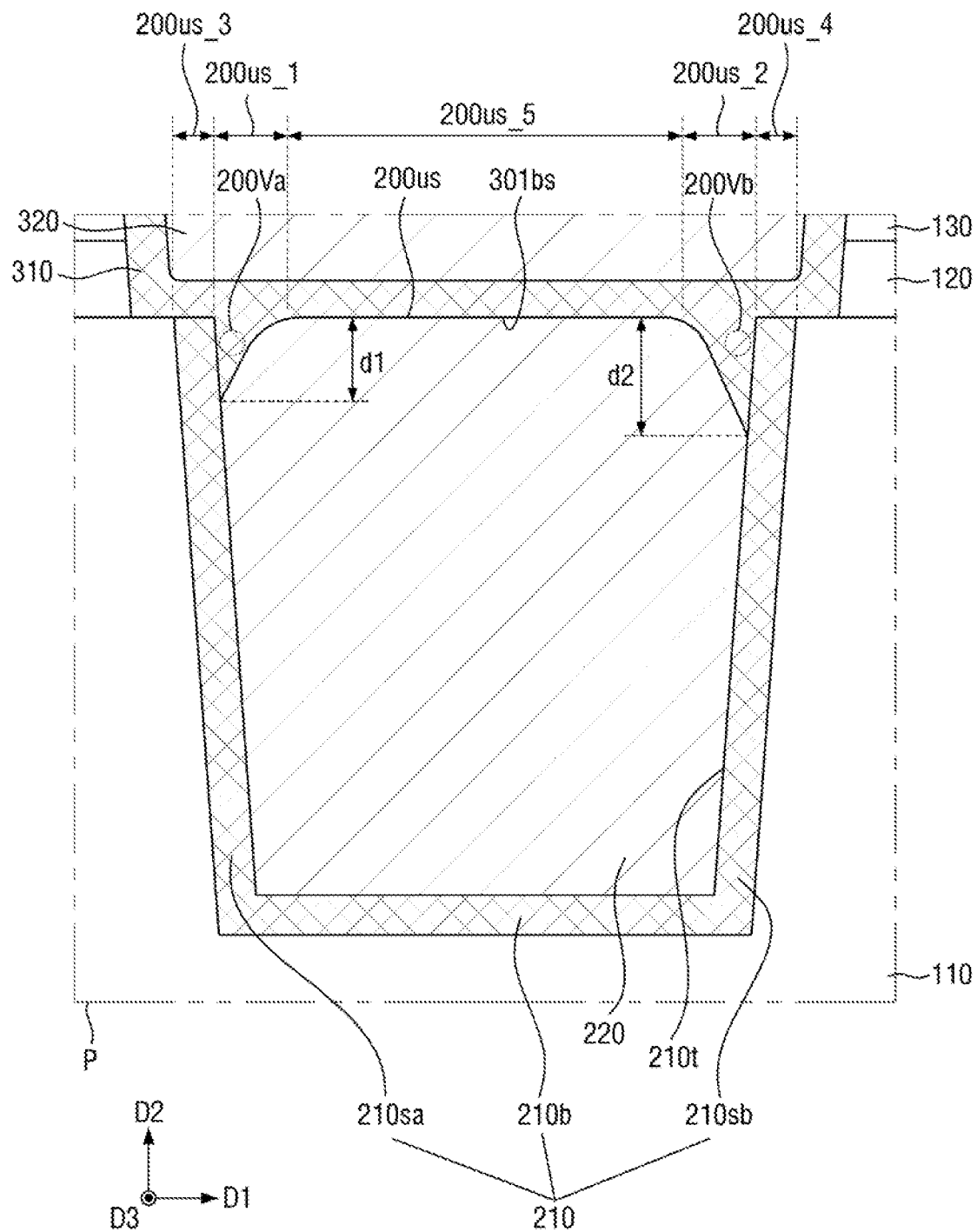
FIG. 3 is an enlarged cross-sectional view of portion P of a semiconductor device according to an exemplary embodiment of the present inventive concepts.
Figure 4:
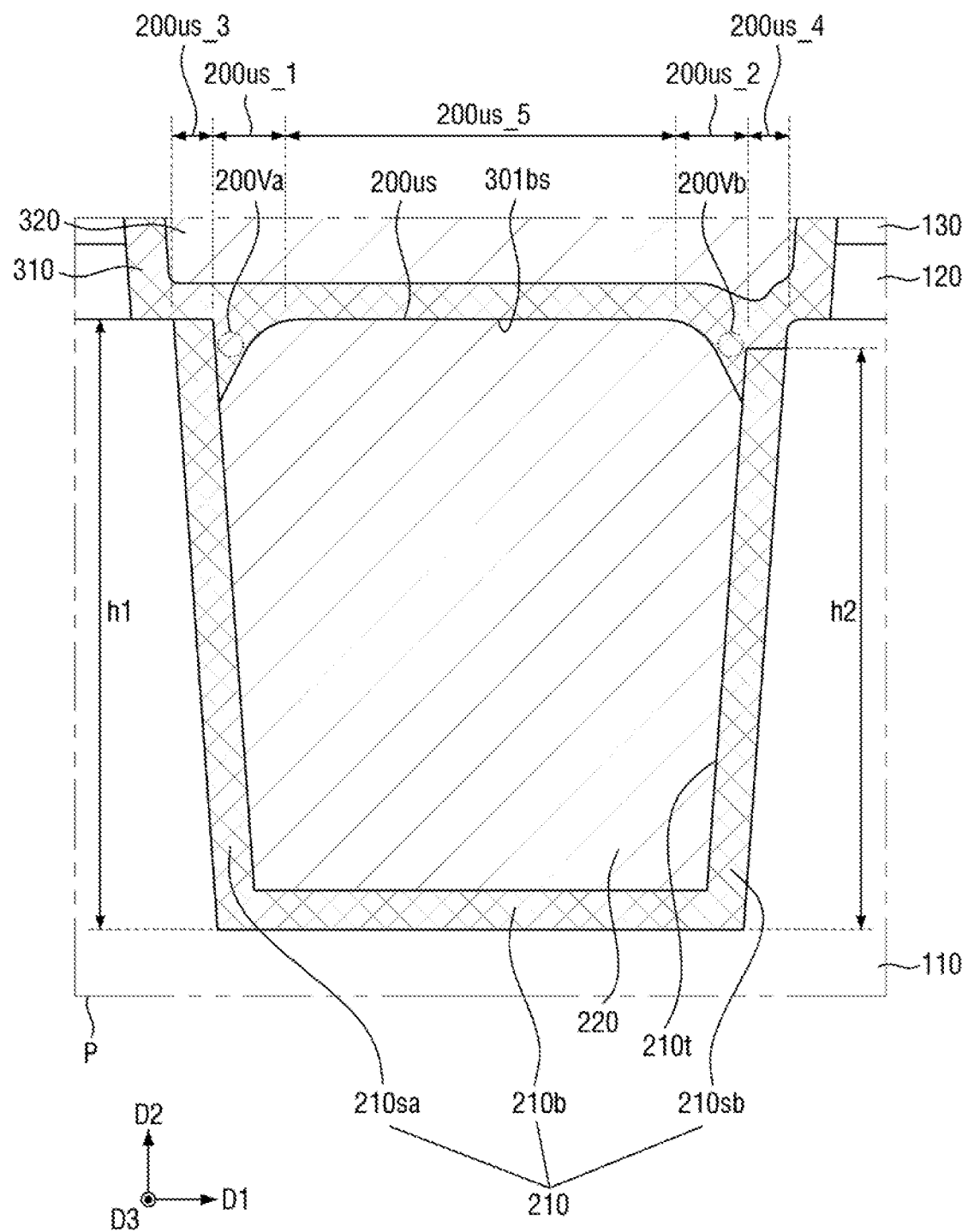
FIG. 4 is an enlarged cross-sectional view of portion P of a semiconductor device according to an exemplary embodiment of the present inventive concepts.
Figure 5:
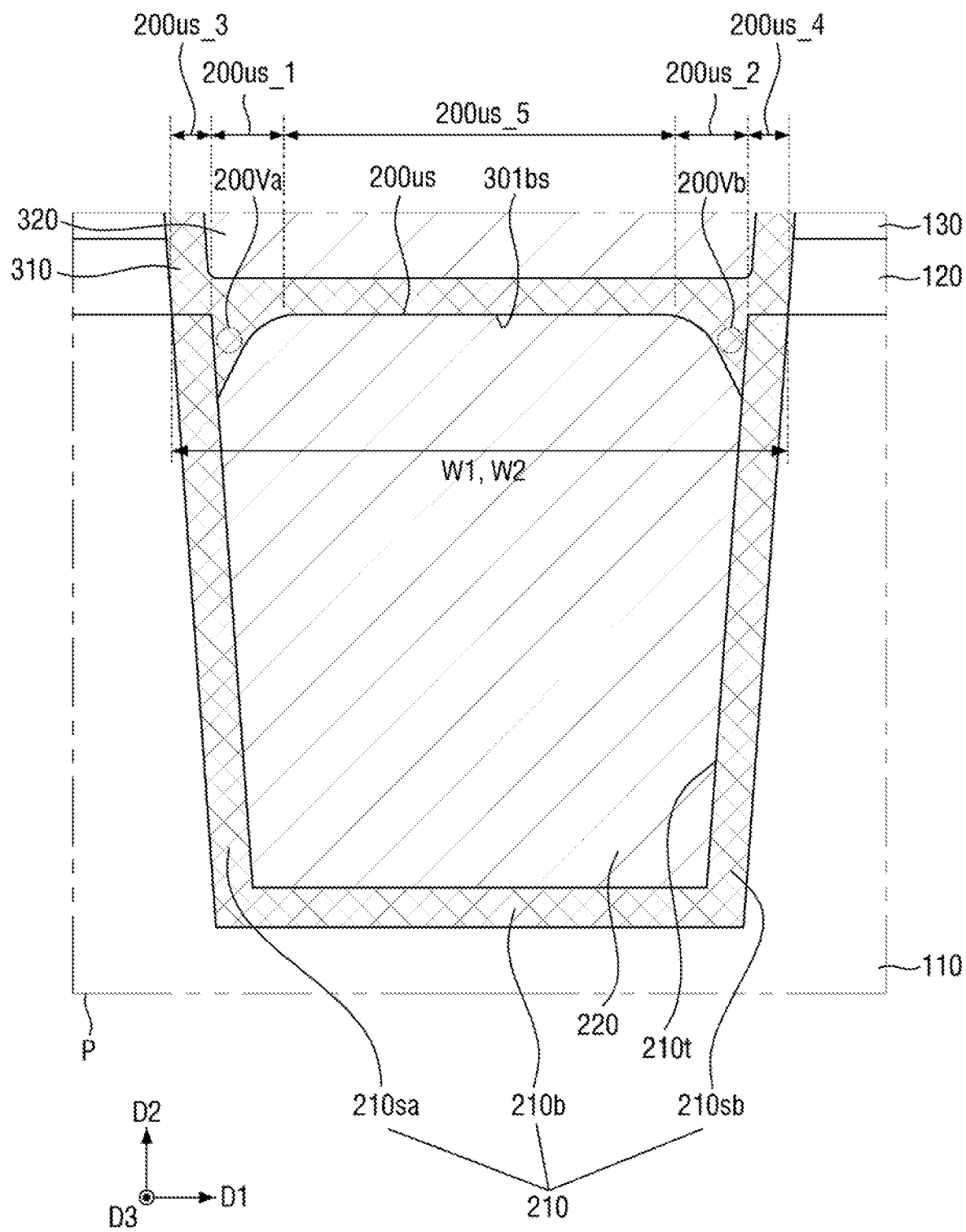
FIG. 5 is an enlarged cross-sectional view of portion P of a semiconductor device according to an exemplary embodiment of the present inventive concepts.
Figure 6:
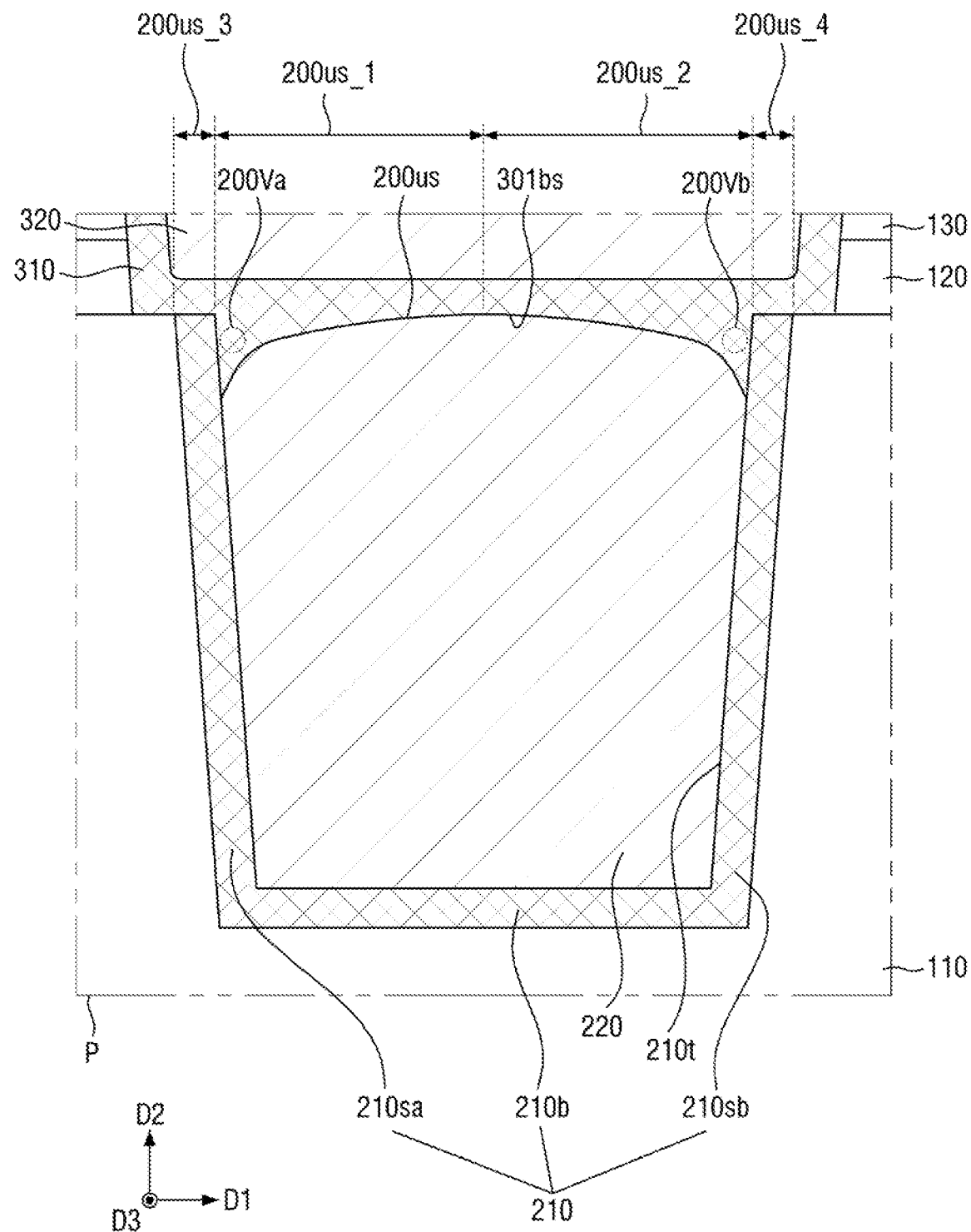
FIG. 6 is an enlarged cross-sectional view of portion P of a semiconductor device according to an exemplary embodiment of the present inventive concepts.

FIG. 3 is an enlarged cross-sectional view of portion P of a semiconductor device according to an exemplary embodiment of the present inventive concepts. FIG. 4 is an enlarged cross-sectional view of portion P of a semiconductor device according to an exemplary embodiment of the present inventive concepts. FIG. 5 is an enlarged cross-sectional view of a portion P of a semiconductor device according to an exemplary embodiment of the present inventive concepts. FIG. 6 is an enlarged cross-sectional view of portion P of a semiconductor device according to an exemplary embodiment of the present inventive concepts. For convenience, the semiconductor devices of FIGS. 3 through 6 will hereinafter be described, focusing mainly on the differences with the semiconductor device of FIGS. 1 and 2.

FIGS. 3 through 6 are enlarged cross-sectional views of portions of semiconductor devices according to some exemplary embodiments of the present inventive concepts that correspond to the portion P of FIG. 1.

Referring to FIG. 3, a first depth d1 of the first valley area 20Va may differ from a second depth d2 of the second valley area 200Vb.

For example, the height (e.g., length in the second direction D2) of the upper portion of the first sidewall portion 210sa of a lower barrier film 210 that is not covered by a lower filling film 220 may differ from the height of the upper portion of a second sidewall portion 210sb of the lower barrier film 210 that is not covered by the lower filling film 220.

For example, the height (e.g., length in the second direction D2) of the upper portion of the first sidewall portion 210sa of the lower barrier film 210 that is covered by an upper barrier film 310 may differ from the height of the upper portion of the second sidewall portion 210sb of the lower barrier film 210 that is covered by the upper barrier film 310. As shown in the exemplary embodiment of FIG. 3, the second depth d2 of the second valley area 200VB may be greater than the first depth d1 of the first valley area 20Va. However, exemplary embodiments of the present inventive concepts are not limited thereto.

The exemplary embodiment of FIG. 3 shows the upper barrier film 310 as entirely filling the second valley area 200Vb. However, exemplary embodiments of the present inventive concepts are not limited thereto. For example, in another exemplary embodiment, the second valley area 200Vb may be only partially filled with the upper barrier film 310 and the second valley area 200Vb may also be filled with the upper filling film 320 depending on the second depth d2 of the second valley area 200Vb and the thickness of the upper barrier film 310.

As shown in the exemplary embodiment of FIG. 4, a first height h1 (e.g., length in the second direction D2) of the first sidewall portion 210sa of a lower barrier film 210 may differ from a second height h2 of the second sidewall portion 210sb of the lower barrier film 210.

However, the depth of a first valley area 200Va may be the same as the depth of the second valley area 200Vb.

The height of the upper portion of the first sidewall portion 210sa of the lower barrier film 210 that is not covered by a lower filling film 220 may differ from the height of the upper portion of the second sidewall portion 210sb of the lower barrier film 210 that is not covered by the lower filling film 220.

Referring to the exemplary embodiment of FIG. 5, a width W1 (e.g., length in the first direction D1), of a top surface 200us of a first lower conductive pattern 200_1 may be the same as a width W2 (e.g., length in the first direction D1), of a bottom surface 301bs of an upper conductive pattern 300.

In the exemplary embodiment shown in FIG. 5, the first upper via 301 of the upper conductive pattern 300 may be disposed to be aligned with the first lower conductive pattern 200_1. For example, the sidewalls forming the first upper via 301 and the first and second sidewalls 210sa, 210sb of the first lower conductive pattern 200_1 may be aligned in the second direction D2.

Referring to the exemplary embodiment of FIG. 6, a top surface 200us of a first lower conductive pattern 200_1 may not include a valley connecting portion 200us_5.

A first valley portion 200us_1 of the top surface 200us of the first lower conductive pattern 200_1 may be directly connected to a second valley portion 200us_2 of the top surface 200us. In this embodiment, the top surface of the lower filling film 220 may be generally curved and may not be flat. Therefore, the curved surfaces of the top surface of the lower filling film 220 may form portions of the first and second valley portions 200us_1, 200us_2 of the top surface 200us and the uppermost surface of the top surface 200us of the first lower conductive pattern 200_1 may form a common edge for the first and second valley portions 200us_1, 200us_2.

Figure 7:
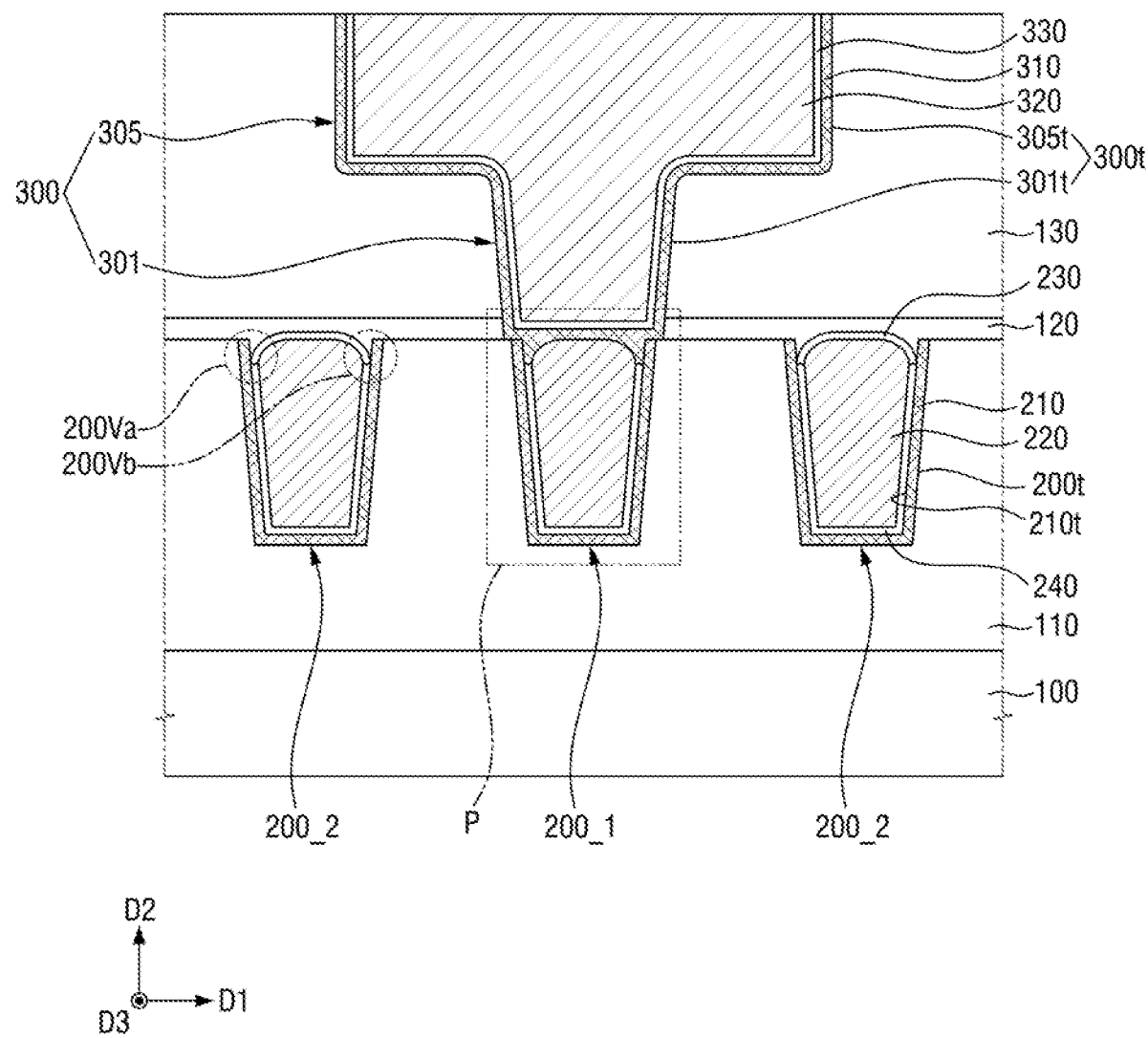
FIG. 7 is a cross-sectional view of a semiconductor device according to an exemplary embodiment of the present inventive concepts.
Figure 8:
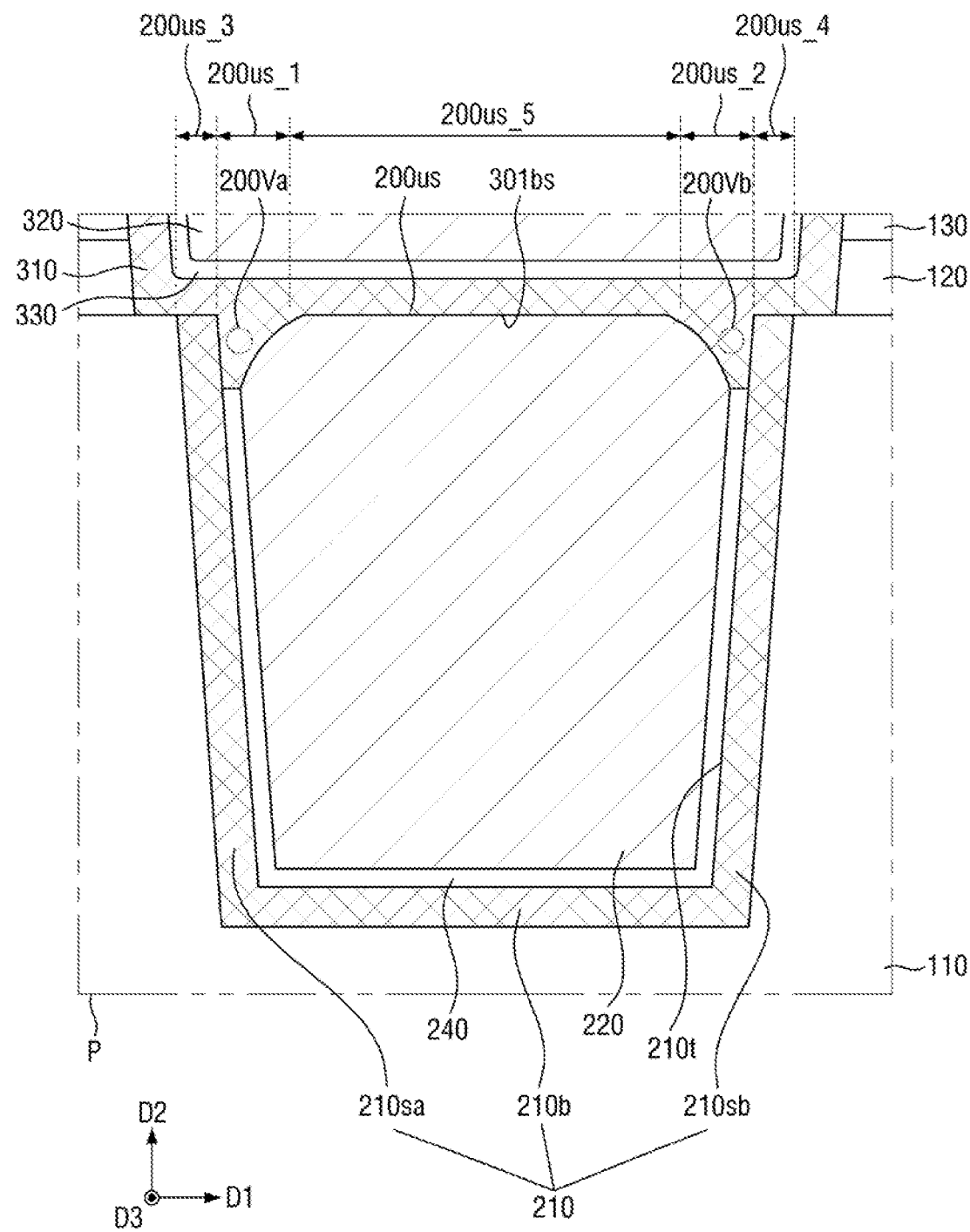
FIG. 8 is an enlarged cross-sectional view of a portion P of the semiconductor device of FIG. 7 according to an exemplary embodiment of the present inventive concepts.

FIG. 7 is a cross-sectional view of a semiconductor device according to an exemplary embodiment of the present inventive concepts. FIG. 8 is an enlarged cross-sectional view of portion P of the semiconductor device of FIG. 7 according to an exemplary embodiment of the present inventive concepts. The semiconductor device of FIGS. 7 and 8 will hereinafter be described, focusing mainly on the differences with the semiconductor device of FIGS. 1 and 2.

Referring to FIGS. 7 and 8, each of the first and second lower conductive patterns 200_1 and 200_2 may further include a lower liner 240. An upper conductive pattern 300 may further include an upper liner 330.

The lower liner 240 may be disposed between the lower barrier film 210 and the lower filling film 220. The lower liner 240 may be disposed on the lower barrier film 210. For example, the lower liner 240 may be formed along a partial portion of the profile of the lower barrier film 210.

The lower liner 240 may extend along the bottom of each of filling film trenches 210t and portions of the sidewalls of each of the filling film trenches 210t. The lower liner 240 may not cover upper portions of the first and second sidewall portions 210sa and 210sb of the lower barrier film 210.

Referring to FIG. 8, first and second valley areas 200Va and 200Vb of a first lower conductive pattern 200_1 may be defined by the lower barrier film 210, the lower liner 240, and lateral edges of the lower filling film 220. The first and second valley areas 200Va and 200Vb may be defined by upper portions of the first and second sidewall portions 210sa and 210sb of the lower barrier film 210 that are not covered by the lower liner 240, the top surface of the lower liner 240, and the lateral edges (e.g., in the first direction D1) of the top surface of the lower filling film 220.

A first valley portion 200us_1 of a top surface 200us of the first lower conductive pattern 200_1 may include a left lateral edge of the top surface of the lower filling film 220, the top surface of the lower liner 240, and an upper portion of a first sidewall portion 210sa of the lower barrier film 210 that is not covered by the lower liner 240. A second valley portion 200us_2 of the top surface 200us of the first lower conductive pattern 200_1 may include a right lateral edge of the top surface of the lower filling film 220, the top surface of the lower liner 240, and an upper portion of a second sidewall portion 210sb of the lower barrier film 210 that is not covered by the lower liner 240.

An uppermost portion of the lower liner 240 (e.g., in the second direction D2) may be lower than uppermost portions of the first and second sidewall portions 210sa and 210sb of the lower barrier film 210. The uppermost portion of the lower liner 240 may be lower than an uppermost portion of the lower filling film 220.

The bottom portions of the first and second valley areas 200Va and 200Vb may be defined by the lower liner 240, such as the uppermost portion of the lower liner 240.

The upper liner 330 may be disposed between the upper barrier film 310 and an upper filling film 320. The upper liner 330 may be disposed on the upper barrier film 310. The upper liner 330 may be formed along the profile of the upper barrier film 310. For example, the upper liner 330 may cover a bottom surface and sidewall surfaces of the upper barrier film 310.

In an exemplary embodiment, the lower and upper liners 240 and 330 may include at least one of compound selected from Co, Ru, and Mn. However, exemplary embodiments of the present inventive concepts are not limited thereto.

Figure 9:
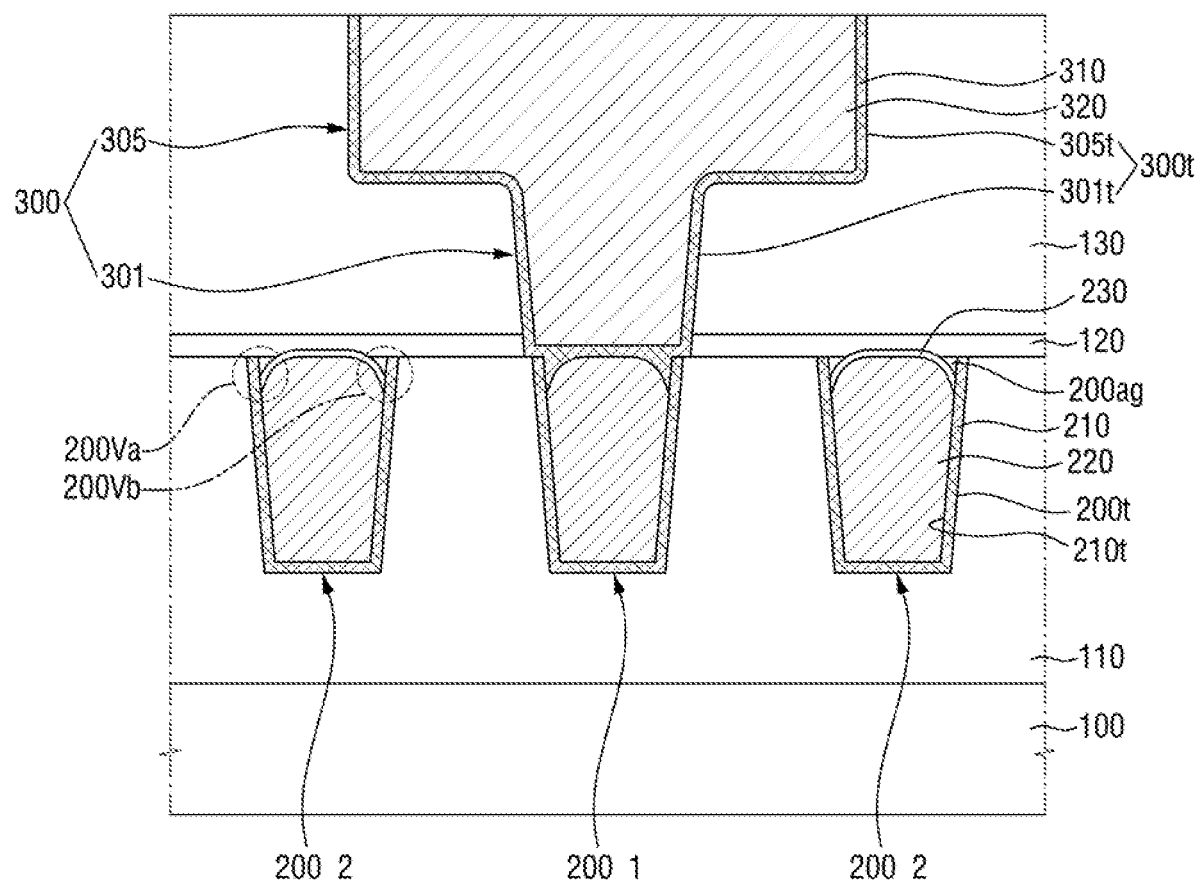
FIG. 9 is a cross-sectional view of a semiconductor device according to an exemplary embodiment of the present inventive concepts.

FIG. 9 is a cross-sectional view of a semiconductor device according to an exemplary embodiment of the present inventive concepts. The semiconductor device of the exemplary embodiment of FIG. 9 will hereinafter be described, focusing mainly on the differences with the semiconductor device of FIGS. 1 and 2.

Referring to the exemplary embodiment of FIG. 9, at least one of first and second valley areas 200Va and 200Vb of each of second lower conductive patterns 200_2 may include a wire void 200ag.

For example, as shown in the exemplary embodiment of FIG. 9, the first and second valley areas 200Va and 200Vb may both include a wire void 200ag. A wire void 200ag may be formed in each of the first and second valley areas 200Va and 200Vb. However, exemplary embodiments of the present inventive concepts are not limited thereto.

One or more wire voids 200ag may be defined between a lower surface of an etching stopper film 120 and the top surface of the lateral edges of each of the second lower conductive patterns 200_2.

In an alternative embodiment, the first valley area 200Va may be filled with an insulating material, and a wire void 200ag may be formed only in the second valley area 200Vb. In another exemplary embodiment, the second valley area 200Vb may be filled with an insulating material, and a wire void 200ag may be formed only in the first valley area 200Va.

Figure 10:
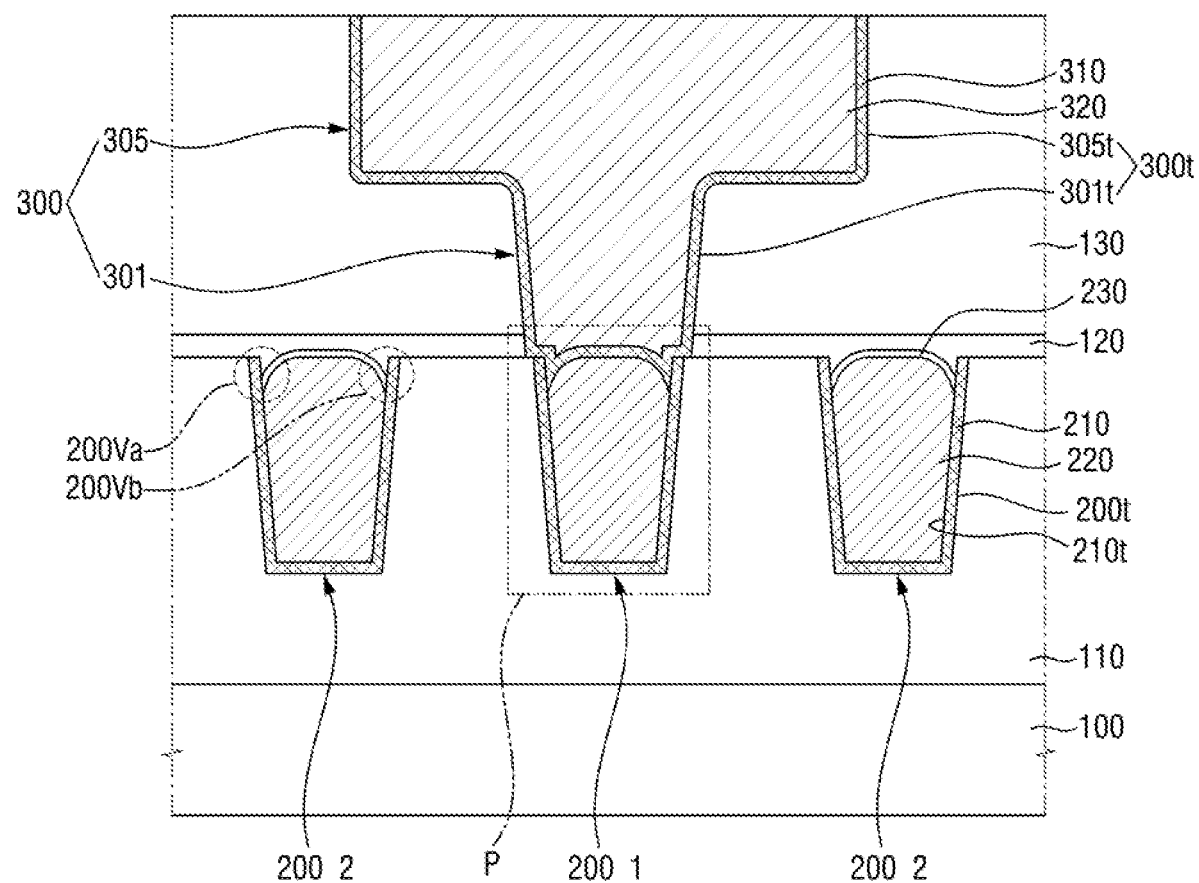
FIG. 10 is a cross-sectional view of a semiconductor device according to an exemplary embodiment of the present inventive concepts.
Figure 11:
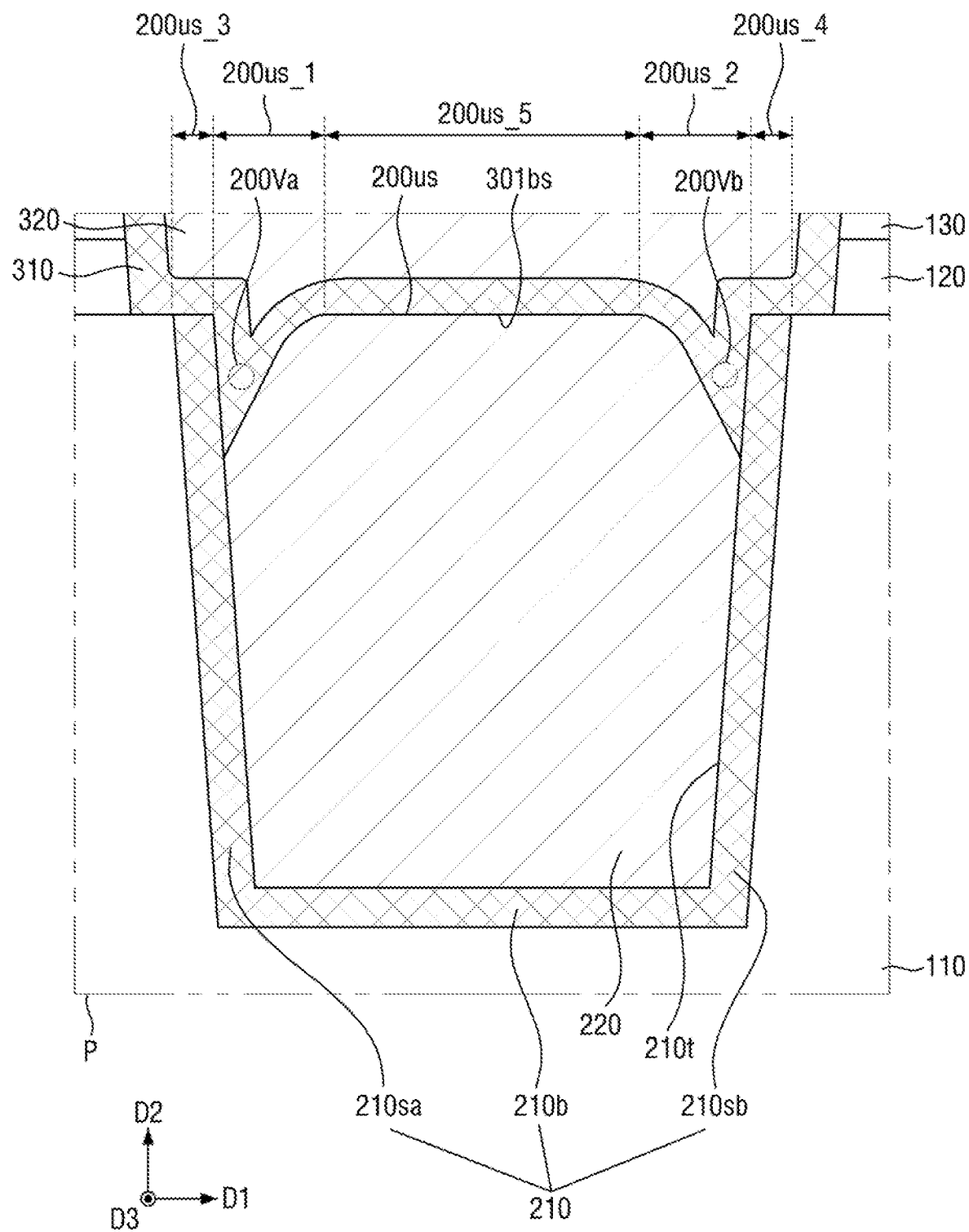
FIG. 11 is an enlarged cross-sectional view of portion P of the semiconductor device of FIG. 10 according to an exemplary embodiment of the present inventive concepts.

FIG. 10 is a cross-sectional view of a semiconductor device according to an exemplary embodiment of the present inventive concepts. FIG. 11 is an enlarged cross-sectional view of a portion P of the semiconductor device of FIG. 10 according to an exemplary embodiment of the present inventive concepts. The semiconductor device of FIGS. 10 and 11 will hereinafter be described, focusing mainly on the differences with the semiconductor device of FIGS. 1 and 2.

Referring to FIGS. 10 and 11, an upper barrier film 310 may extend along the profile of a top surface 200us of a first lower conductive pattern 200_1.

For example, as shown in the exemplary embodiments of FIGS. 10-11, the upper barrier film 310 may extend along the profiles of a first protruding portion 200us_3, a first valley portion 200us_1, a valley connecting portion 200us_5, a second valley portion 200us_2, and a second protruding portion 200us_4 of the top surface of the first lower conductive pattern 200us_1.

A first valley area 200Va and/or a second valley area 200Vb of the first lower conductive pattern 200_1 that remain(s) unfilled with the upper barrier film 310 may be filled with an upper filling film 320. For example, as shown in the exemplary embodiments of FIGS. 10-11, the upper barrier film 310 may each have a recessed portion that extends below a height of top surfaces of the first and second protruding portions 200us_3, 200us_4. The upper filling film 320 may fill the recessed portions in the upper barrier film 310 to fill the portions of the first valley area 200Va and second valley area 200Vb that remain unfilled by the upper barrier film 310.

Figure 12:
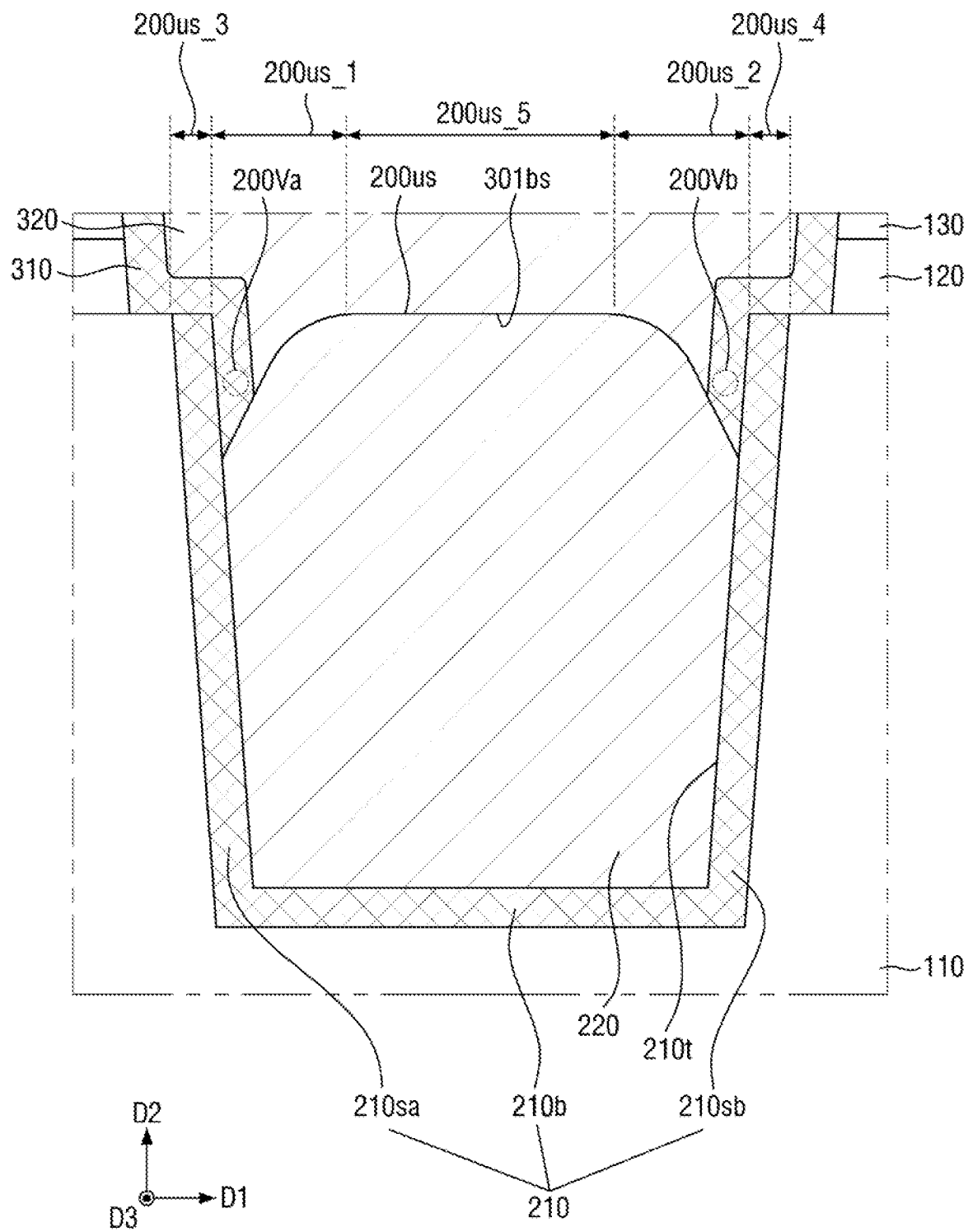
FIG. 12 is an enlarged cross-sectional view of portion P of a semiconductor device according to an exemplary embodiment of the present inventive concepts.

FIG. 12 is an enlarged cross-sectional view of portion P of a semiconductor device according to an exemplary embodiment of the present inventive concepts. The semiconductor device of FIG. 12 will hereinafter be described, focusing mainly on the differences with the semiconductor device of FIGS. 10 and 11.

Referring to FIG. 12, an upper barrier film 310 may extend along partial portions of the first and second valley portions 200us_I and 200us_2 of a top surface of the first lower conductive pattern 200_1

For example, the upper barrier film 310 may be formed along upper portions of the first and second sidewall portions 210sa and 210sb of the lower barrier film 210. The upper barrier film 310 may be formed on the first and second valley portions 200us_I and 200us_2, which are defined by the first and second sidewall portions 210sa and 210sb of the lower barrier film 210.

However, the upper barrier film 310 may not extend along the top surface of the lower filling film 220. For example, as shown in the exemplary embodiment of FIG. 12, the upper barrier film 310 may not be formed on at least partial portions of the first and second valley portions 200us_1 and 200us_2 and may not be formed on the valley connecting portion 200us_5. For example, portions of the upper barrier film 310 that are formed along the first and second sidewall portions 210sa and 210sb of the lower barrier film 210 may be disposed on lateral edges of the top surface of the lower filling film 220. However, as shown in the exemplary embodiment of FIG. 12, the upper barrier film 310 may not cover portions of the first and second valley portions 200us_1, 200us_2 that are defined by the lower filling film 220. For example, the upper barrier film 310 may not cover partial portions of the lateral edges of the first and second valley portions 200us_1, 200us_2 distal from the first and second sidewall portions 210sa, 210sb and the relatively flat valley connecting portion 200us_5 that are defined by the lower filling film 220.

In an exemplary embodiment, before the formation of the upper barrier film 310, surface treatment may be performed on the top surface of the lower filling film 220. As a result, the upper barrier film 310 may not be formed on the top surface of the lower filling film 220.

Figure 13:
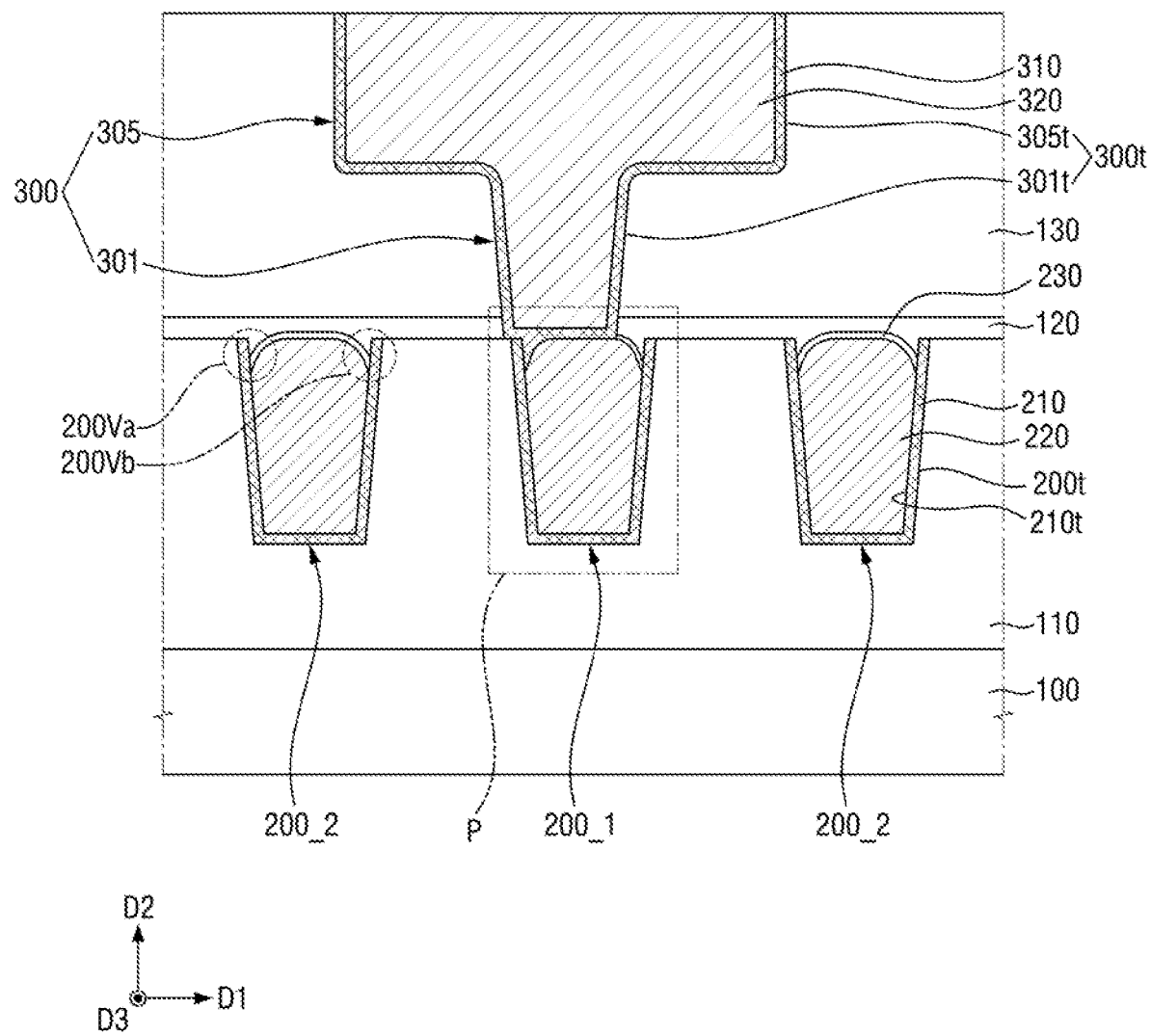
FIG. 13 is a cross-sectional view of a semiconductor device according to an exemplary embodiment of the present inventive concepts.
Figure 14:
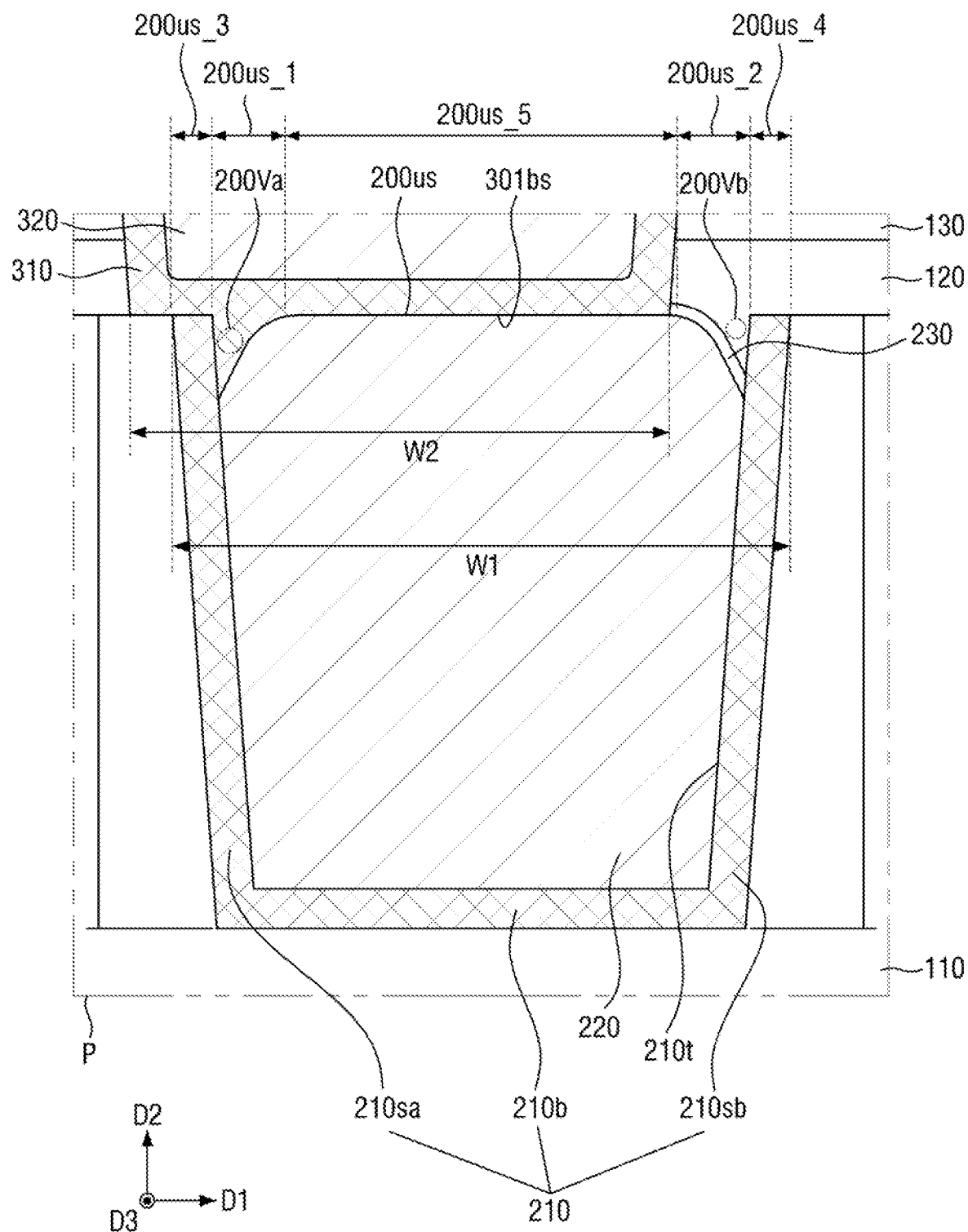
FIGS. 14 and 15 are enlarged cross-sectional views of portion P of semiconductor devices according to exemplary embodiments of the present inventive concepts.
Figure 15:
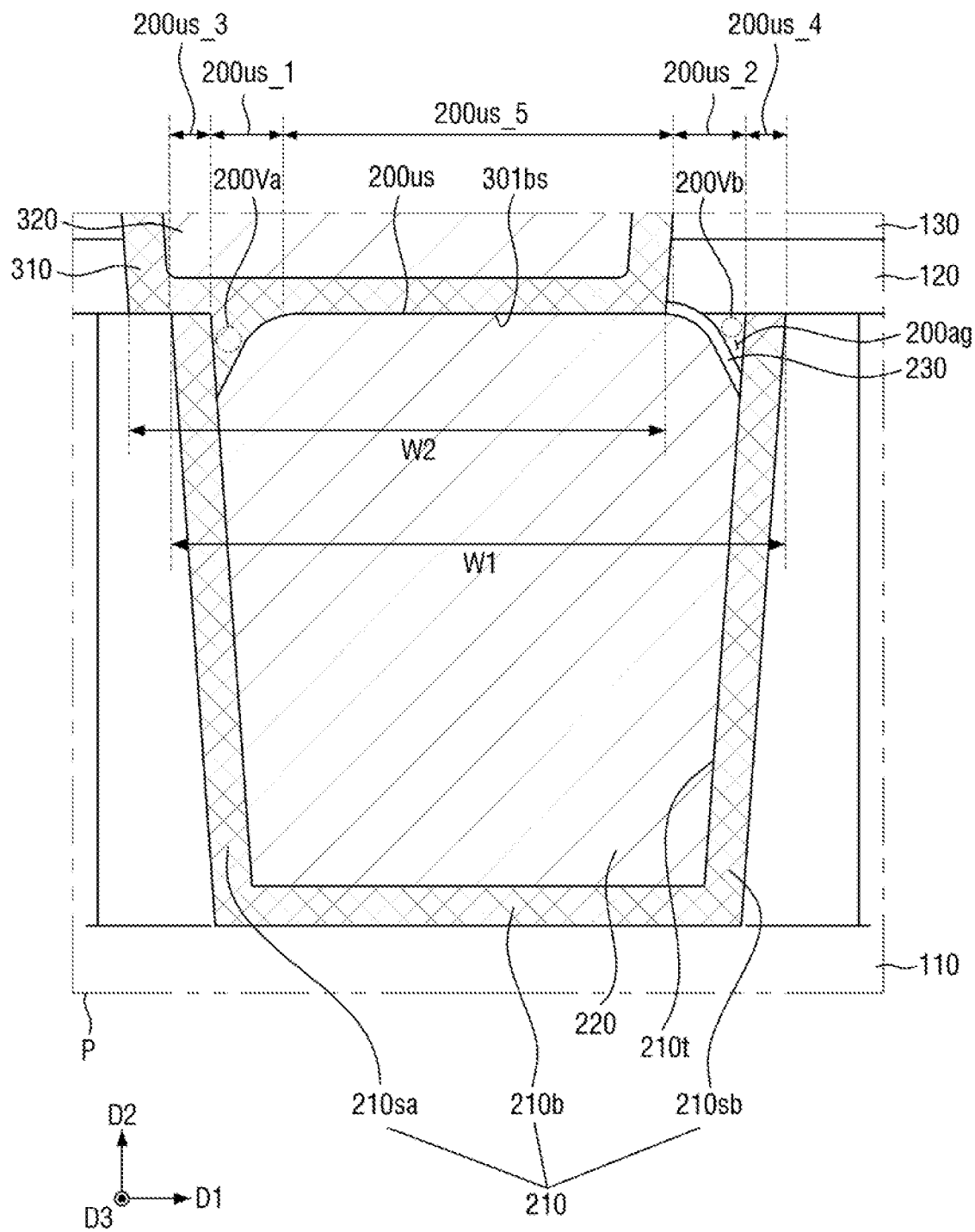

FIG. 13 is a cross-sectional view of a semiconductor device according to an exemplary embodiment of the present inventive concepts. FIGS. 14 and 15 are enlarged cross-sectional views of portion P of the semiconductor device of FIG. 13 according to exemplary embodiments of the present inventive concepts. The semiconductor device of FIGS. 13 through 15 will hereinafter be described, focusing mainly on the differences with the semiconductor device of FIGS. 1 and 2.

Referring to FIGS. 13 through 15, an upper conductive pattern 300 may fill the first valley area 200Va of a first lower conductive pattern 200_1. However, the upper conductive pattern 300 may not fill the second valley area 200Vb of the first lower conductive pattern 200_1.

For example, a bottom surface 301bs of the upper conductive pattern 300 may cover part only a partial portion of a top surface 200us of the first lower conductive pattern 200_1.

As shown in the exemplary embodiment of FIG. 13, a capping film 230 may be formed on the portion of the lower filling film 220 that is not covered by the bottom surface 301bs of the upper conductive pattern 300. However, exemplary embodiments of the present inventive concepts are not limited thereto.

As shown in the exemplary embodiment of FIG. 14, the second valley area 200Vb may be filled with an insulating material. For example, a portion of the etching stopper film 120 may be formed in the second valley area 200Vb. As shown in the exemplary embodiment of FIG. 14, the etching stopper film 120 may be disposed on the capping film 230. For example, a lower surface of the etching stopper film 120 may directly contact an upper surface of the capping film 230.

Referring to the exemplary embodiment shown in FIG. 15, a wire void 200ag may be formed in the second valley area 200Vb. The wire void 200ag may be defined between the etching stopper film 120 and the capping film 230 disposed on the lateral edge of the top surface 200us of the first lower conductive pattern 200_1 defining the second valley area 200Vb.

For example, a width W1 (e.g., length in the first direction D1) of the top surface 200us of the first lower conductive pattern 200I may be greater than a width W2 of the bottom surface 301bs of the upper conductive pattern 300. However, exemplary embodiments of the present inventive concepts are not limited thereto. For example, in another exemplary embodiment, the width W1 may be the same as the width W2. In another exemplary embodiment, the width W1 may be smaller than the width W2.

Figure 16:
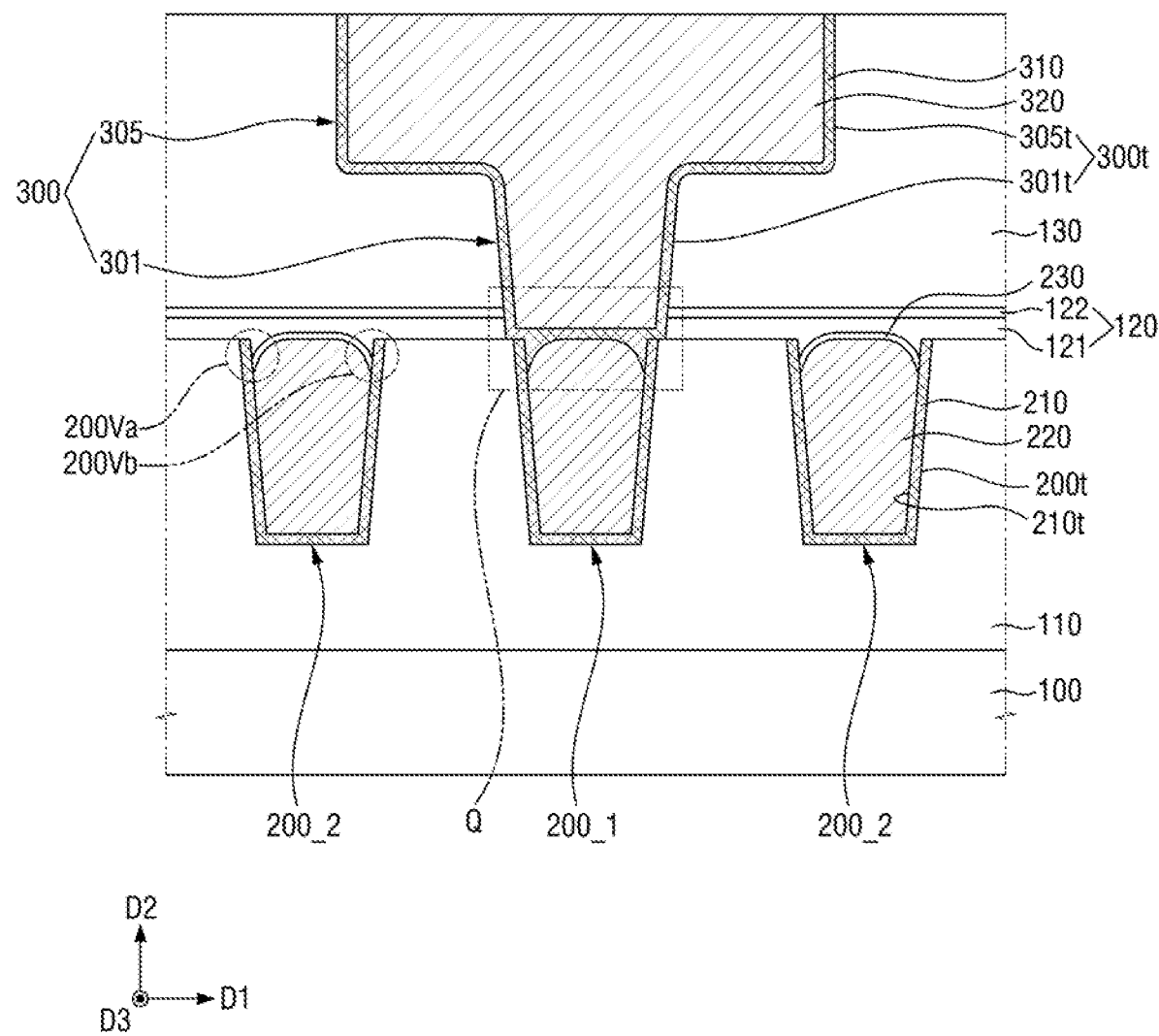
FIG. 16 is a cross-sectional view of a semiconductor device according to an exemplary embodiment of the present inventive concepts.
Figure 17:
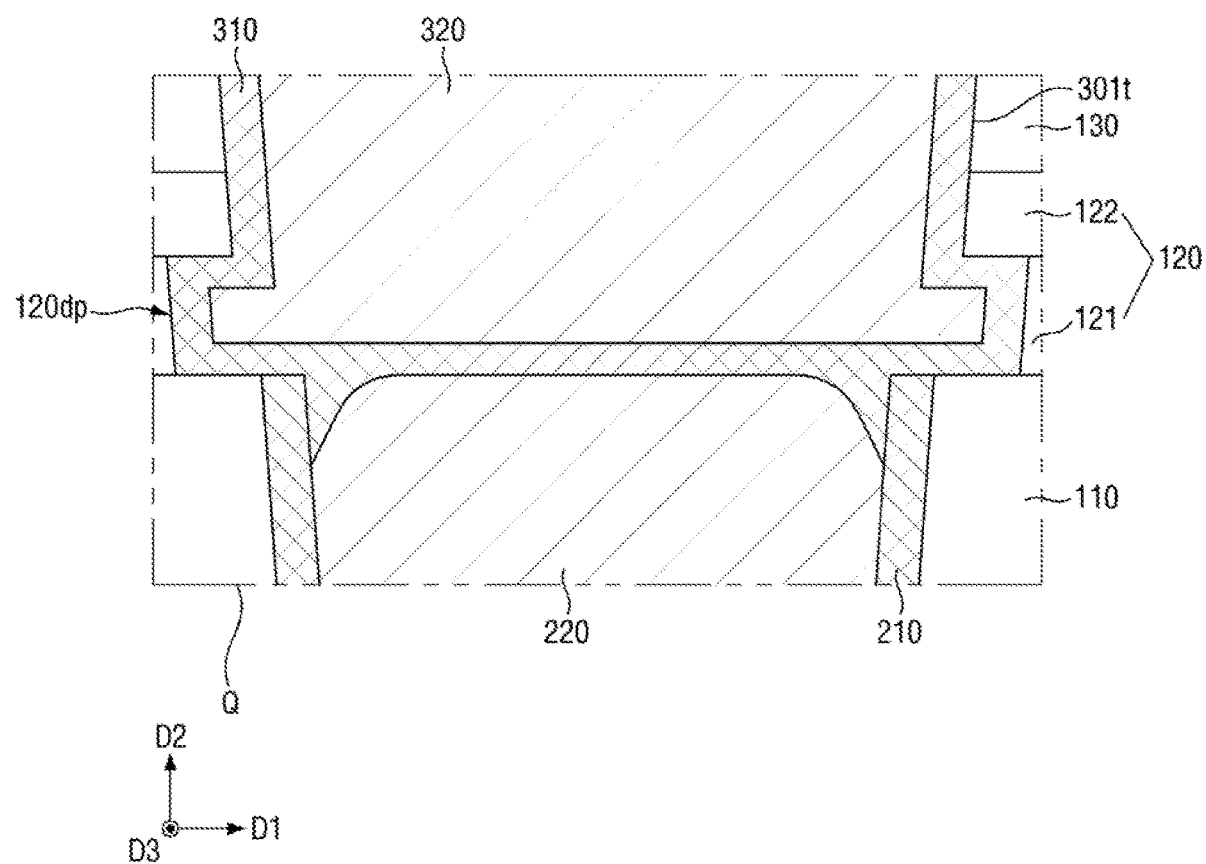
FIGS. 17 and 18 are enlarged cross-sectional views of portion Q of the semiconductor device of FIG. 16 according to exemplary embodiments of the present inventive concepts.
Figure 18:
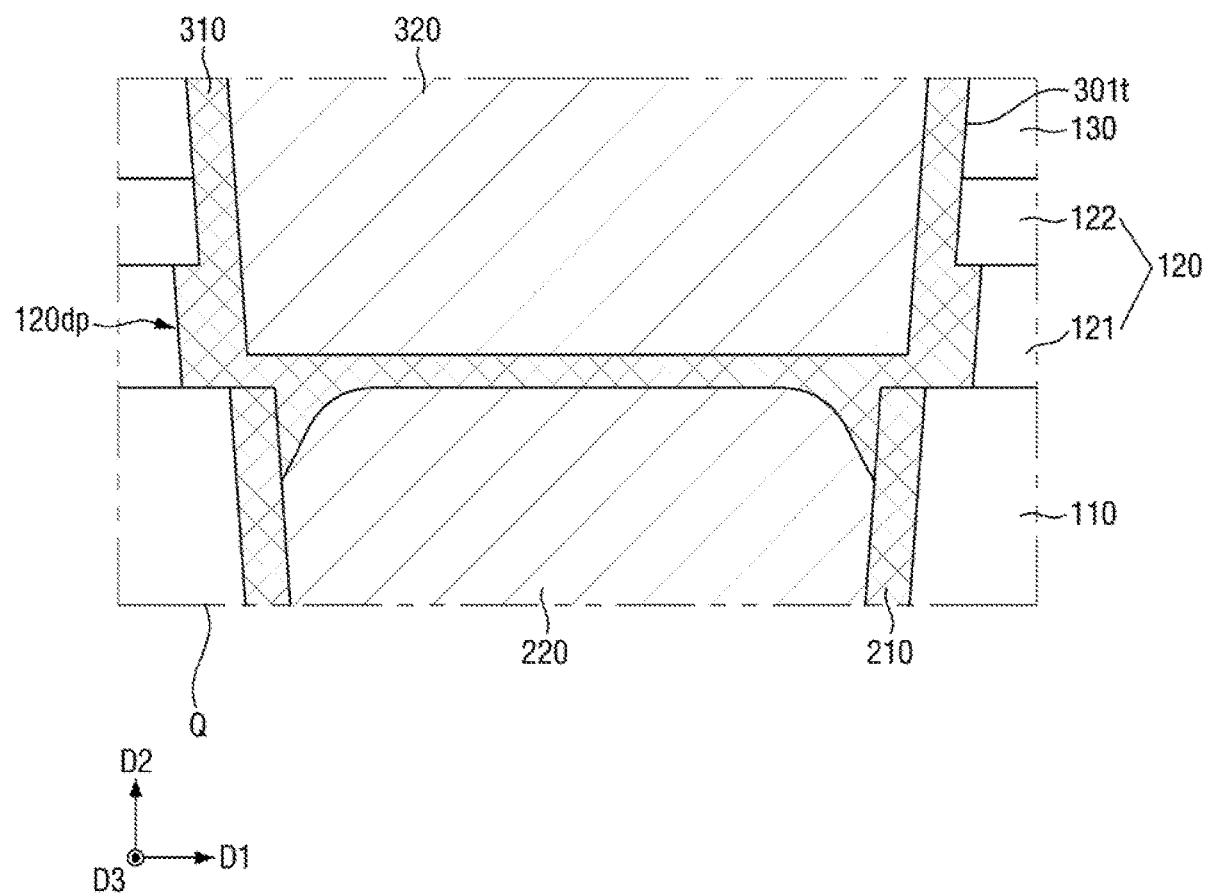

FIG. 16 is a cross-sectional view of a semiconductor device according to an exemplary embodiment of the present inventive concepts. FIGS. 17 and 18 are enlarged cross-sectional views of portion Q of the semiconductor device of FIG. 16 according to exemplary embodiments of the present inventive concepts. The semiconductor device of FIGS. 16 through 18 will hereinafter be described, focusing mainly on the differences with the semiconductor device of FIGS. 1 and 2.

Referring to FIGS. 16 through 18, an etching stopper film 120 may include first and second sub-etching stopper films 121 and 122.

The second sub-etching stopper film 122 may be disposed on the first sub-etching stopper film 121. For example, a lower surface of the second sub-etching stopper film 122 may directly contact an upper surface of the first sub-etching stopper film 121. The first sub-etching stopper film 121 may be disposed between the second sub-etching stopper film 122 and the lower interlayer insulating film 110 (e.g., in the second direction D2).

In an exemplary embodiment, the first sub-etching stopper film 121 may include an insulating material containing a metal. Therefore, the etching stopper film 120 may include a metal. For example, in an exemplary embodiment, the first sub-etching stopper film 121 may include an insulating material containing Al. The first sub-etching stopper film 121 may include at least one compound selected from aluminum oxide (AlO), aluminum nitride (AlN), and aluminum oxycarbide (AlOC). However, exemplary embodiments of the present inventive concepts are not limited thereto.

In the present Specification, the term "aluminum oxycarbide" simply means that the corresponding material contains Al, O, and C, but does not necessarily mean any specific ratio of Al, O, and C in the corresponding material.

In an exemplary embodiment, the second sub-etching stopper film 122 may include a Si-based insulating material. However, exemplary embodiments of the present inventive concepts are not limited thereto.

As shown in the exemplary embodiment of FIG. 17, the etching stopper film 120 may include dimple patterns 120dp. The dimple patterns 120dp may be formed at portions that define the sidewalls of an upper pattern trench 300t. Specifically, the dimple patterns 120dp may be formed at portions that define the sidewalls of a first upper via trench 30t. For example, as shown in the exemplary embodiment of FIG. 17, the dimple patterns 120dp may be formed on bottom portions of the sidewalls of the upper pattern trench 300t. The dimple patterns 120dp may be parts that are recessed into the etching stopper film 120. The dimple patterns 120dp may be portions that are expanded in a first direction D1.

The dimple patterns 120dp may be formed on portions of the sidewalls of the first upper via trench 301t that are defined by the first sub-etching stopper film 121. For example, as shown in the exemplary embodiment of FIG. 17, the dimple patterns 120dp may be formed on both portions of the sidewalls of the first upper via trench 301t that are defined by the first sub-etching stopper film 121. However, exemplary embodiments of the present inventive concepts are not limited thereto and the dimple patterns 120dp may be formed on only one sidewall of the first upper via trench 301t in other exemplary embodiments. In an exemplary embodiment, since wet etching has an isotropic etching characteristic, the dimple patterns 120dp may be formed while the first sub-etching stopper film 121 is being removed by wet etching.

An upper barrier film 310 may fill at least a portion of each of the dimple patterns 120dp. Referring to the exemplary embodiment shown in FIG. 17, the upper barrier film 310 may be formed along the profiles of the dimple patterns 120dp. Portions of the dimple patterns 120dp that remain unfilled may be filled by the upper filling film 320. Therefore, in these exemplary embodiments, a width (e.g., length in the first direction D1) of the upper filling film 320 on the same level as the first sub-etching stopper film 121 may be wider than the width of the upper filling film 320 on the same level as the second sub-etching stopper film 122. Referring to the exemplary embodiment shown in FIG. 18, the upper barrier film 310 may entirely fill the dimple patterns 120*dp*. The cross-sectional structure shown in the exemplary embodiments of FIG. 17 or 18 may be obtained depending on the thickness of the first sub-etching stopper film 121 and the degree to which the first sub-etching stopper film 121 is etched.

Figure 19:
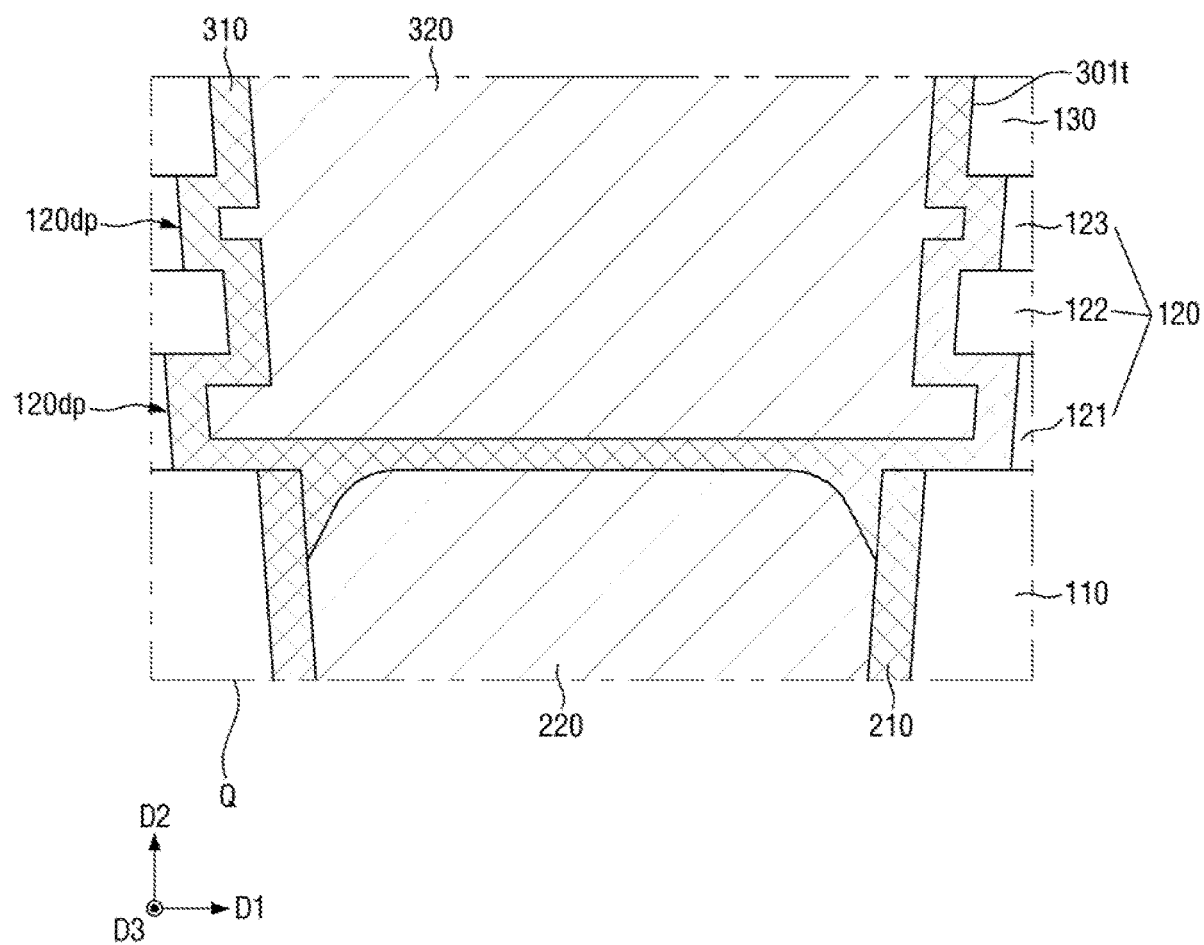
FIG. 19 is an enlarged cross-sectional view of portion Q of the semiconductor device of FIG. 16 according to an exemplary embodiment of the present inventive concepts.

FIG. 19 is an enlarged cross-sectional view of portion Q of a semiconductor device according to an exemplary embodiment of the present inventive concepts. The semiconductor device of FIG. 19 will hereinafter be described, focusing mainly on the differences with the semiconductor device of FIGS. 16 through 18.

Referring to the exemplary embodiment of FIG. 19, an etching stopper film 120 may further include a third sub-etching stopper film 123.

The third sub-etching stopper film 123 may be disposed on a second sub-etching stopper film 122. For example, as shown in the exemplary embodiment of FIG. 19, a lower surface of the third sub-etching stopper film 123 may directly contact an upper surface of the second sub-etching stopper film 122. In an exemplary embodiment, the third sub-etching stopper film 123 may include an insulating material containing a metal. Therefore, the third sub-etching stopper film 123 may include a metal. For example, the third sub-etching stopper film 123 may include an insulating material containing Al. However, exemplary embodiments of the present inventive concepts are not limited thereto.

Dimple patterns 120*dp* may be formed on portions of sidewalls of a first upper via trench 301*t* that are defined by the first sub-etching stopper film 121. The dimple patterns 120*dp* may also be formed on portions of the sidewalls of the first upper via trench 301*t* that are defined by the third sub-etching stopper film 123. The dimple patterns 120*dp* formed in the sidewalls of the first upper via trench 301*t* defined by the first sub-etching stopper film 121 and the third sub-etching stopper film 123 are spaced apart from each other in the second direction D2.

Figure 20:
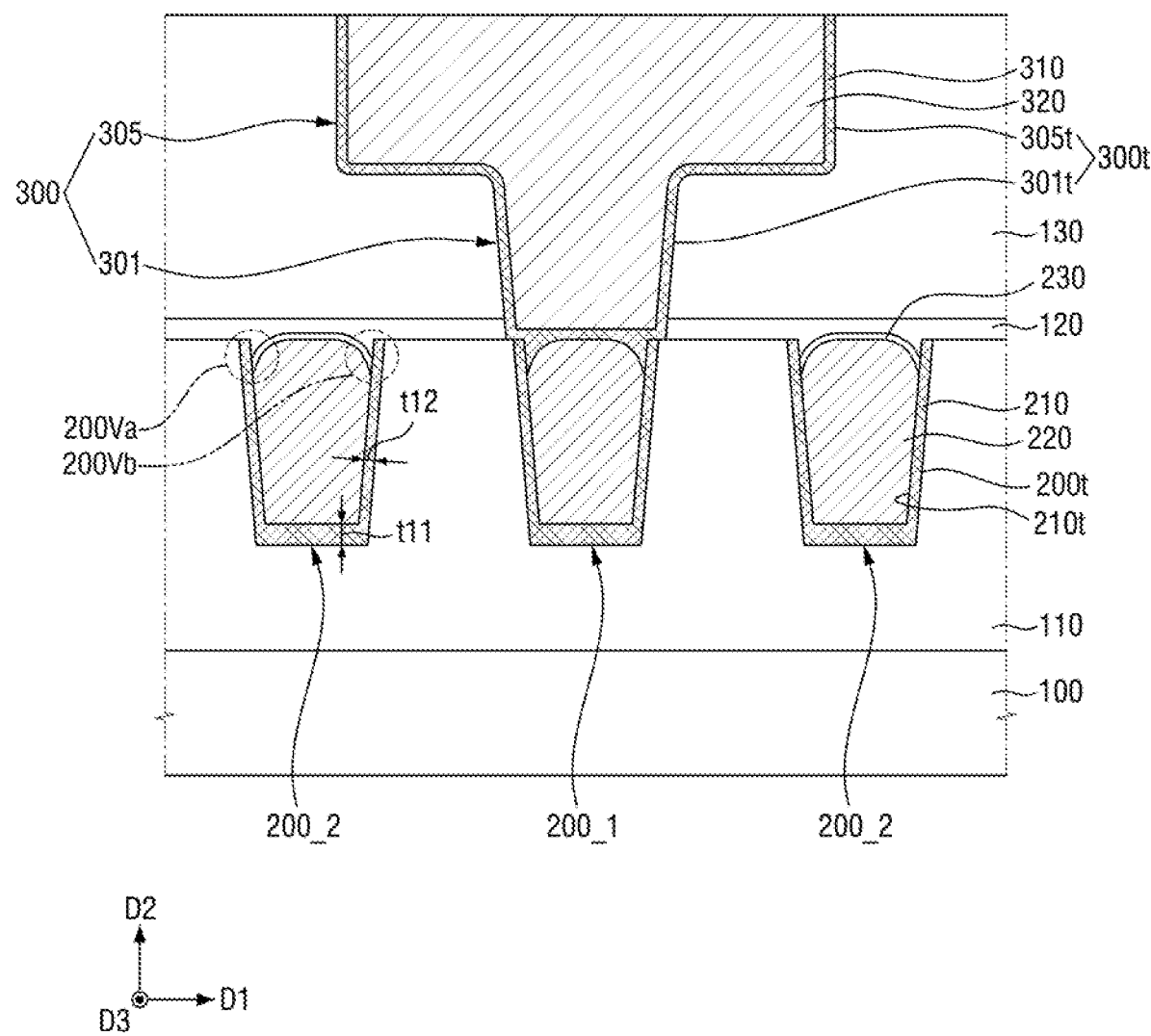
FIG. 20 is a cross-sectional view of a semiconductor device according to an exemplary embodiment of the present inventive concepts.
Figure 21:
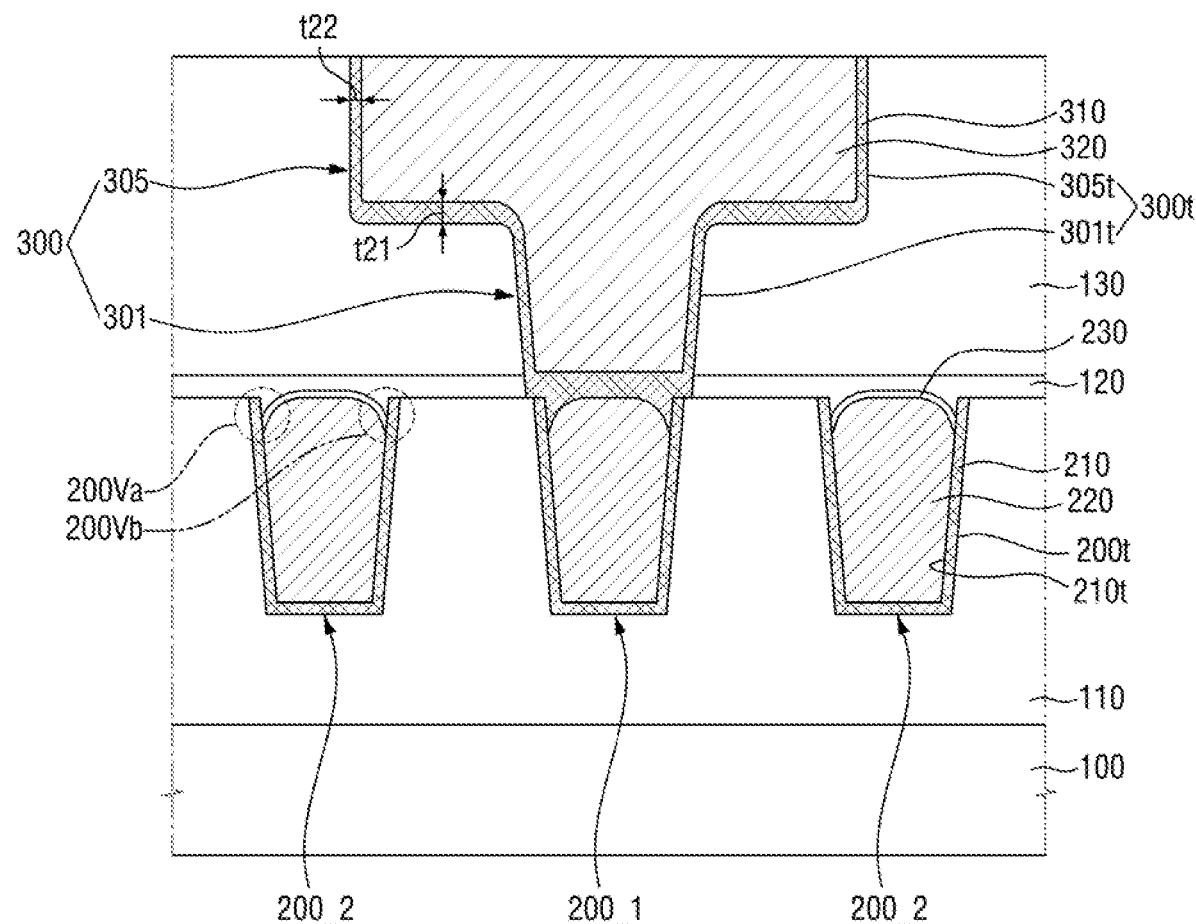
FIG. 21 is a cross-sectional view of a semiconductor device according to an exemplary embodiment of the present inventive concepts.
Figure 22:
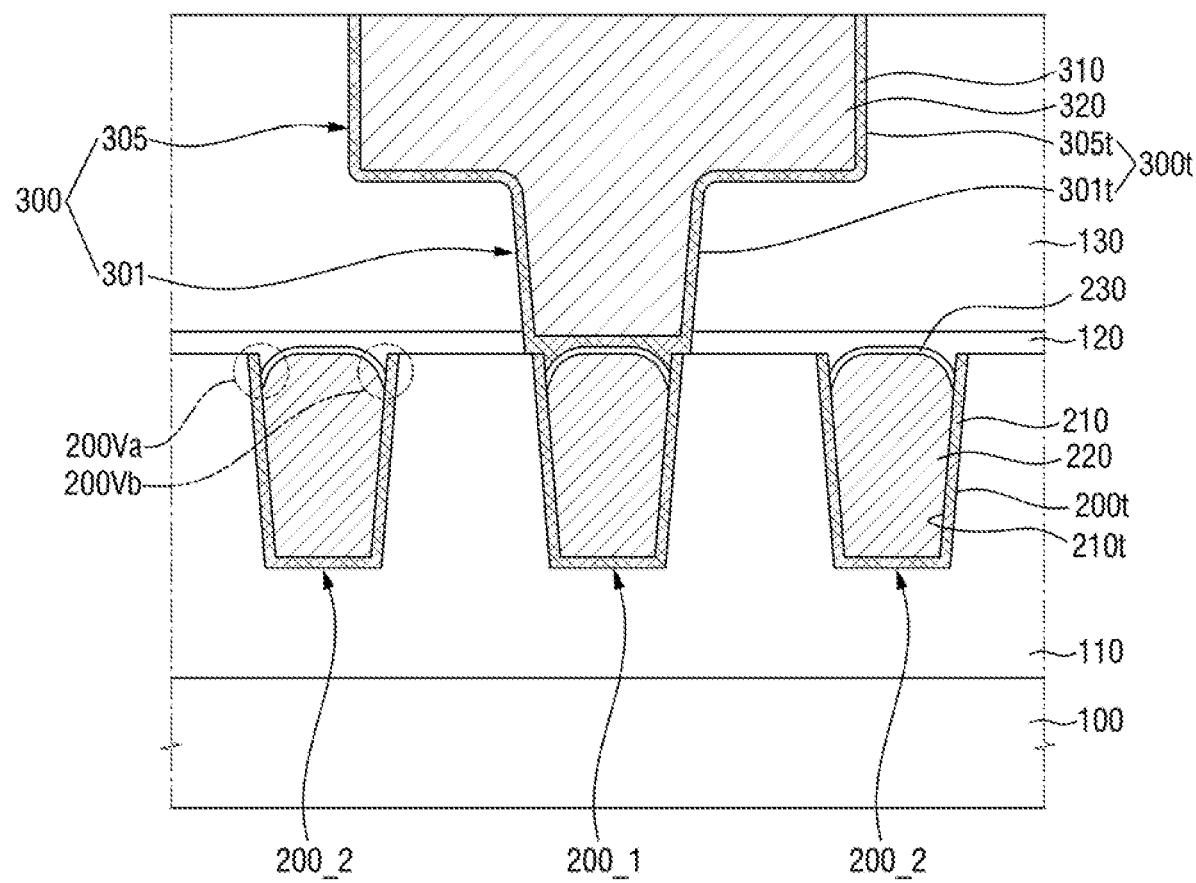
FIG. 22 is a cross-sectional view of a semiconductor device according to an exemplary embodiment of the present inventive concepts.

FIG. 20 is a cross-sectional view of a semiconductor device according to an exemplary embodiment of the present inventive concepts, FIG. 21 is a cross-sectional view of a semiconductor device according to an exemplary embodiment of the present inventive concepts. FIG. 22 is a cross-sectional view of a semiconductor device according to an exemplary embodiment of the present inventive concepts. The semiconductor device shown in the exemplary embodiments of FIGS. 20 through 22 will hereinafter be described, focusing mainly on the differences with the exemplary embodiments of the semiconductor device shown in FIGS. 1 and 2.

Referring to FIG. 20, the upper barrier film 310 may be conformally formed along an upper pattern trench 300*t*. However, the lower barrier film 210 may not be conformally formed along lower pattern trenches 200*t*.

For example, the thickness (e.g., length in the second direction D2) of the portion of the upper barrier film 310 at the bottom of the upper wire trench 305*t* which extends generally in the first direction D1 may be substantially the same as the thickness (e.g., length in the first direction D1) of portions of the upper barrier film 310 on sidewalls of the upper wire trench 305*t*.

However, a thickness t11 (e.g., length in the second direction D2) of portions of the lower barrier film 210 at the bottom of the lower pattern trenches 200*t* may be greater than a thickness t12 (e.g., length in the first direction D1) of portions of the lower barrier film 210 on sidewalls of each of the lower pattern trenches 200*t*.

For example, in an exemplary embodiment, the upper barrier film 310 may be formed by a deposition method with an excellent step coverage, and the lower barrier film 210 may be formed by a deposition method with a poor step coverage.

Referring to the exemplary embodiment shown in FIG. 21, the lower barrier film 210 may be conformally formed along the lower pattern trenches 200*t*. However, the upper barrier film 310 may not be conformally formed along the upper pattern trench 300*t*.

For example, a thickness t21 (e.g., length in the second direction D2) of the portion of the upper barrier film 310 at the bottom of the upper wire trench 305*t* may be greater than a thickness t22 (e.g., length in the first direction D1) of the portions of the upper barrier film 310 on the sidewalls of the upper wire trench 305*t*.

However, as shown in the exemplary embodiment of FIG. 21, the thickness of the portions of the lower barrier film 210 at the bottoms of the lower pattern trenches 200*t* may be substantially the same as the thickness of the portions of the lower barrier film 210 on the sidewalls of each of the lower pattern trenches 200*t*.

In an exemplary embodiment, the lower barrier film 210 may be formed by a deposition method with an excellent step coverage, and the upper barrier film 310 may be formed by a deposition method with a poor step coverage.

However, exemplary embodiments of the present inventive concepts are not limited thereto. For example, in another exemplary embodiment, both the upper barrier film 310 and the lower barrier film 210 may not be conformally formed along the upper pattern trench 300*t* and the lower pattern trenches 200*t*, respectively.

Referring to the exemplary embodiment of FIG. 22, each of first lower conductive patterns 200_1 may include a capping film 230.

The capping film 230 may be disposed between the upper conductive pattern 300 and the upper surface of the lower filling film 220 (e.g., in the second direction D2).

Figure 23:
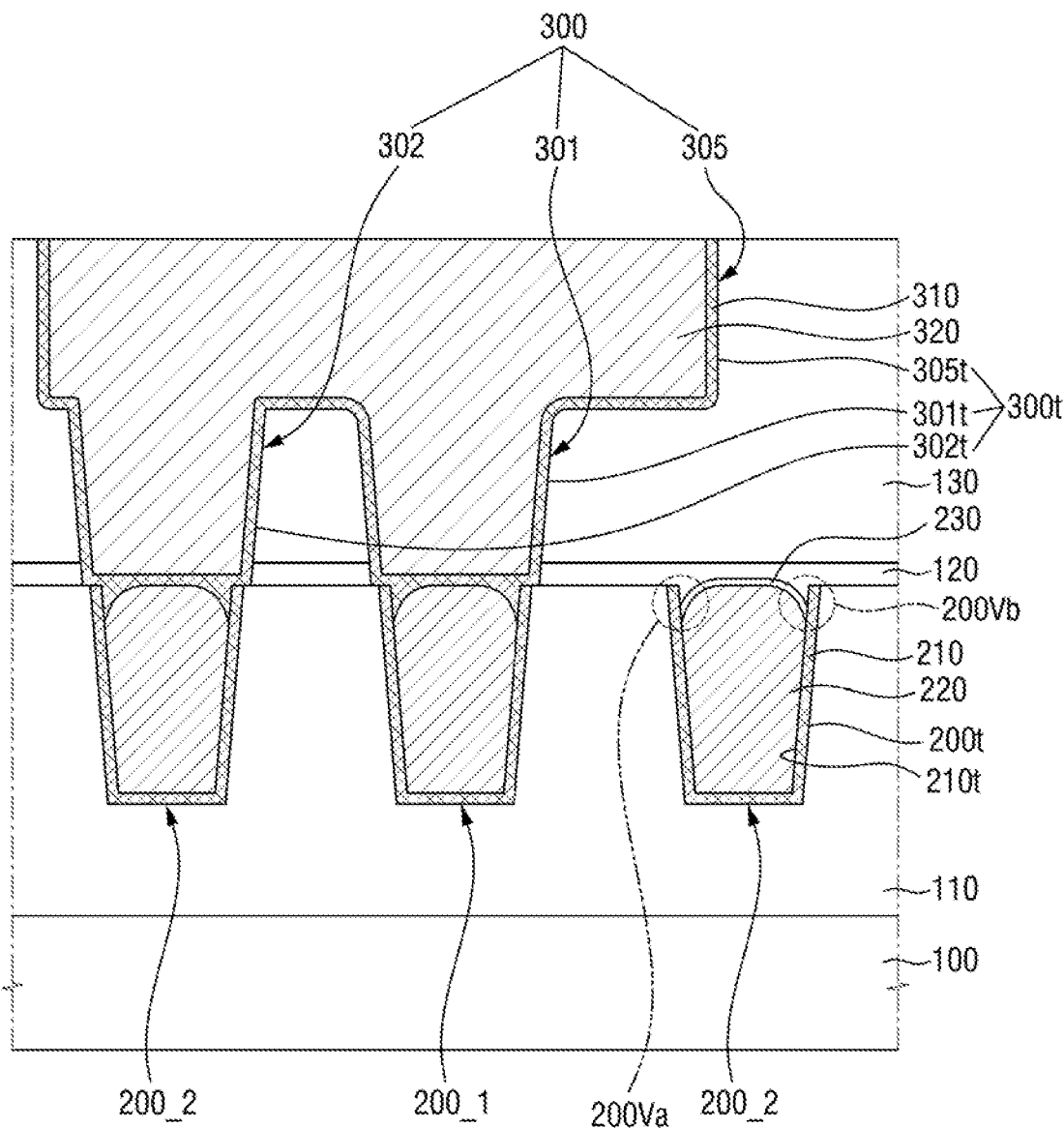
FIG. 23 is a cross-sectional view of a semiconductor device according to an exemplary embodiment of the present inventive concepts.

FIG. 23 is a cross-sectional view of a semiconductor device according to an exemplary embodiment of the present inventive concepts. FIG. 24 is a cross-sectional view of a semiconductor device according to an exemplary embodiment of the present inventive concepts.

Referring to the exemplary embodiment of FIG. 23, an upper conductive pattern 300 may further include a second upper via 302 that is spaced apart from the first upper via 301 in the first direction D1.

The second upper via 302 may fill a second upper via trench 302*t*. The second upper via 302 may be connected to a second lower conductive patterns 2002.

As shown in the exemplary embodiment of FIG. 23, the bottom of the second upper via 302 may entirely cover the top surface of a second lower conductive patterns 200_2. However, exemplary embodiments of the present inventive concepts are not limited thereto. For example, in another exemplary embodiment, the second upper via 302 may cover only a partial portion of the top surfaces of the second lower conductive pattern 200_2.

Referring to the exemplary embodiment of FIG. 24, the upper conductive pattern 300 may not include an upper connecting wire, such as the upper connecting wire 305 shown in the exemplary embodiment of FIG. 1.

In the exemplary embodiment shown in FIG. 24, the upper conductive pattern 300 may solely include a first upper via 301.

FIGS. 25 through 29 are cross-sectional views illustrating a method of fabricating a semiconductor device according to exemplary embodiments of the present inventive concepts.

Figure 25:
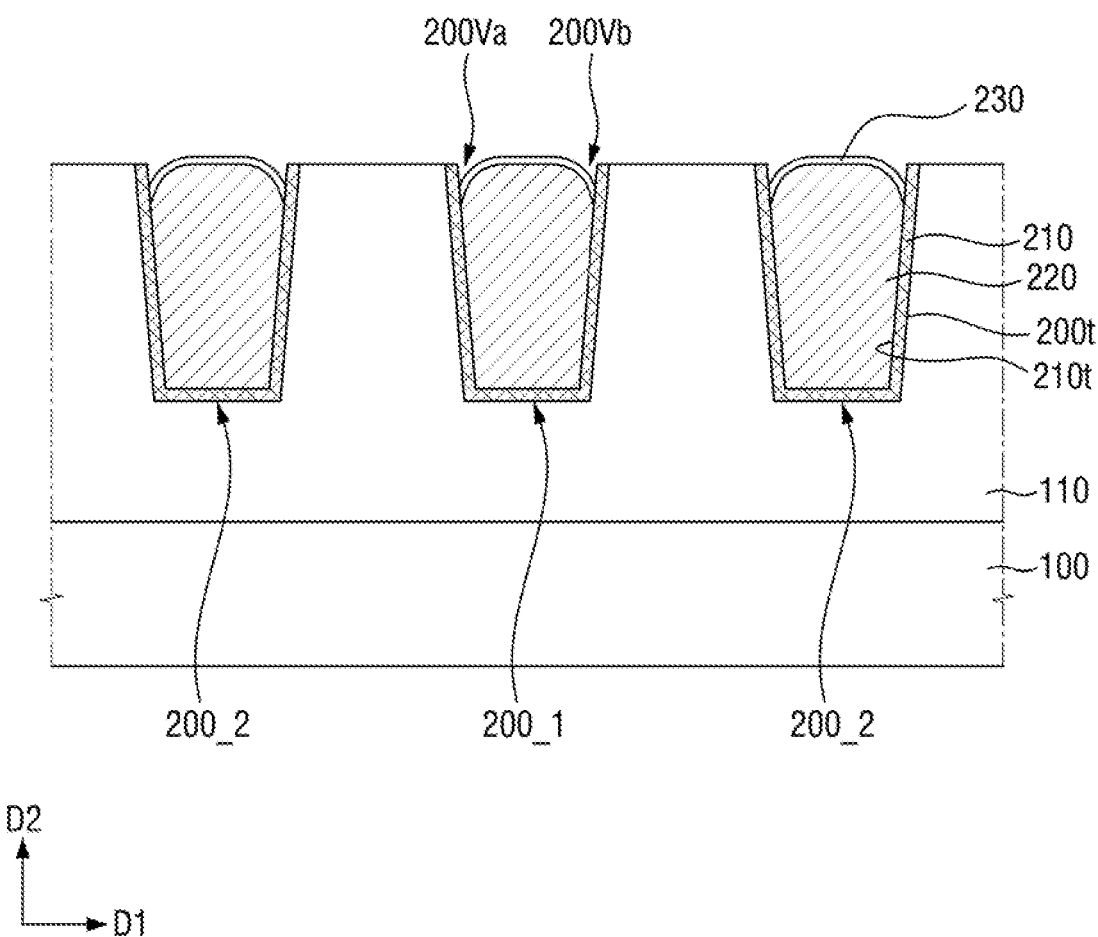
FIGS. 25 through 29 are cross-sectional views illustrating a method of fabricating a semiconductor device according to exemplary embodiments of the present inventive concepts.

Referring to the exemplary embodiment shown in FIG. 25, first and second lower conductive patterns 200_1 and 200_2 may be formed in a lower interlayer insulating film 110 on a substrate 110.

Each of the first and second lower conductive patterns 200_1 and 200_2 may include a lower barrier film 210, which is formed along lower pattern trenches 200t, and a lower filling film 220, which is formed on the lower barrier film 210. A capping film 230 may be formed along the top surface of the lower filling film 220.

Each of the first and second lower conductive patterns 200_1 and 200_2 may include first and second valley areas 200Va and 200Vb, which extend in the thickness direction of the lower interlayer insulating film 110 (e.g., in the second direction D2).

Figure 26:
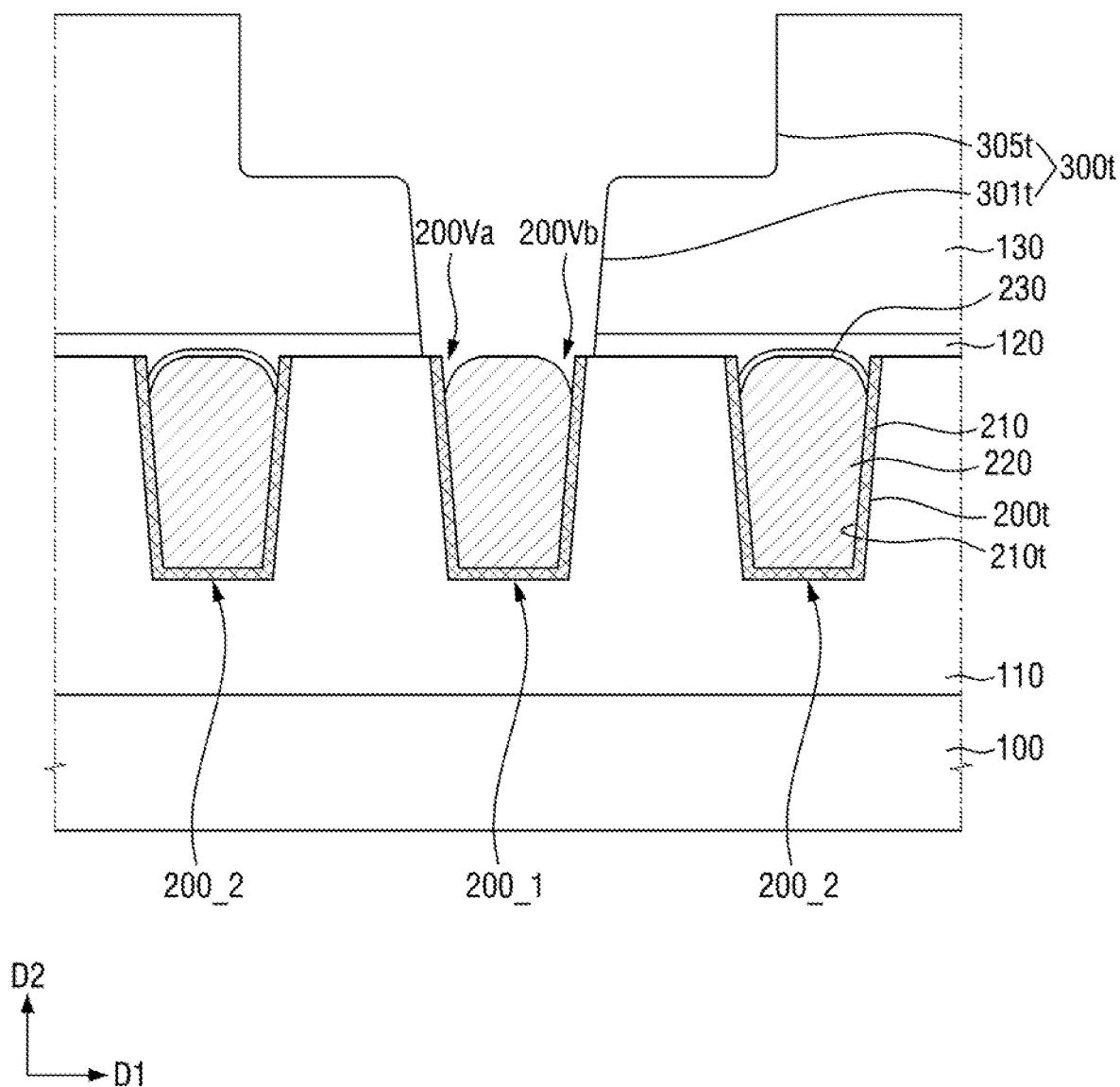

Referring to the exemplary embodiment of FIG. 26, an etching stopper film 120 and an upper interlayer insulating film 130 may be sequentially formed on the lower interlayer insulating film 110 (e.g., in the second direction D2).

An upper pattern trench 300t, which exposes at least a partial portion of a first lower conductive pattern 200_1, may be formed in the etching stopper film 120 and the upper interlayer insulating film 130. The capping film 230 formed on the lower filling film 220 of the first lower conductive pattern 200_1 may be etched and removed. The upper pattern trench 300t may include a first upper via trench 301t and an upper wire trench 305t.

Figure 27:
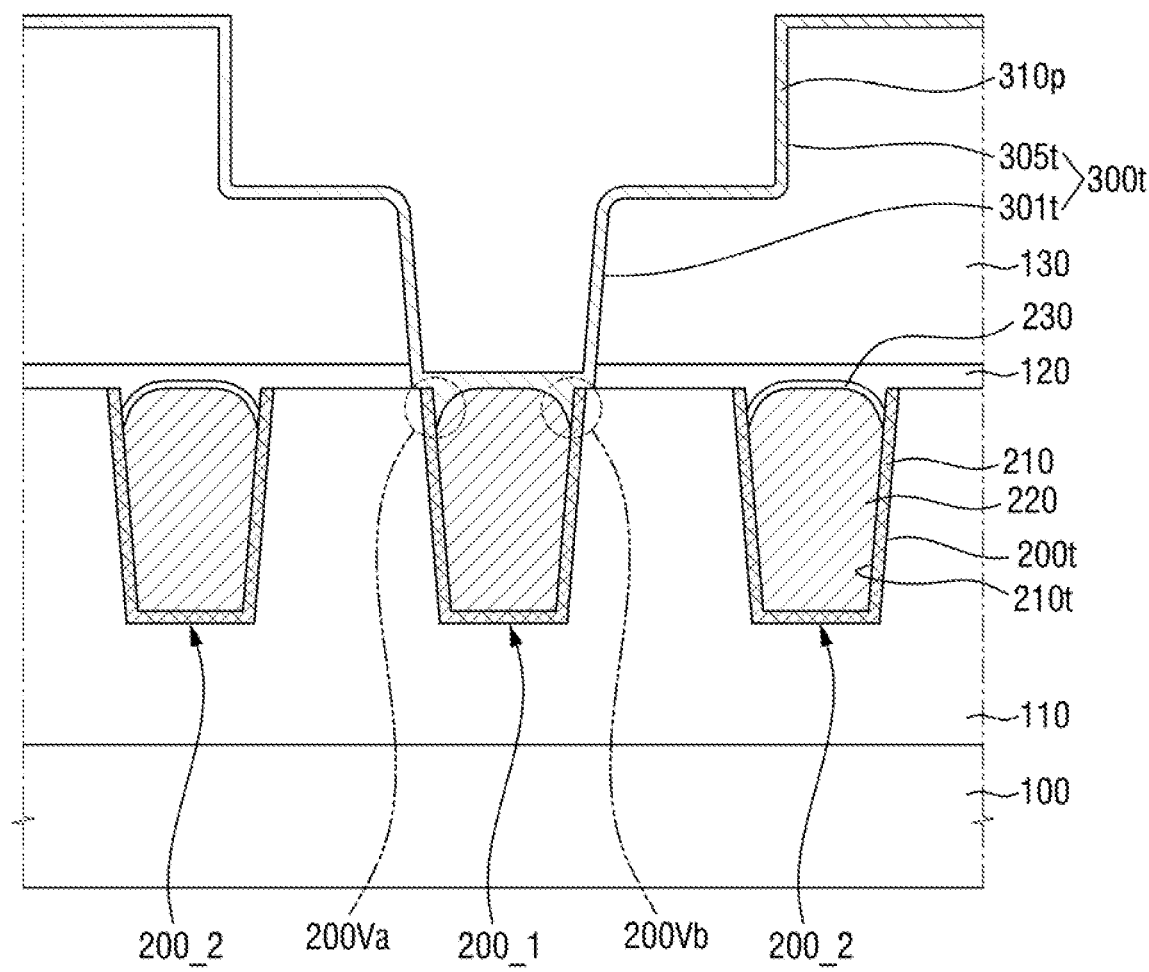

Referring to the exemplary embodiment of FIG. 27, a pre-upper barrier film 310p may be formed along sidewalls of the upper pattern trench 300t and the first and second valley areas 200Va and 200Vb of the first lower conductive pattern 200_1.

The pre-upper barrier film 310p may be formed on the sidewalls of the first upper via trench 301t, the sidewalls and the bottom of the upper wire trench 305t, and the surfaces of the first and second valley areas 200Va and 200Vb of the first lower conductive pattern 200_1. As shown in the exemplary embodiment of FIG. 27, the pre-upper barrier film 310p may entirely fill the first and second valley areas 200Va and 200Vb of the first lower conductive pattern 200_1. However, exemplary embodiments of the present inventive concepts are not limited thereto.

In an exemplary embodiment, the pre-upper barrier film 310p may be formed by atomic layer deposition (ALD).

Figure 28:
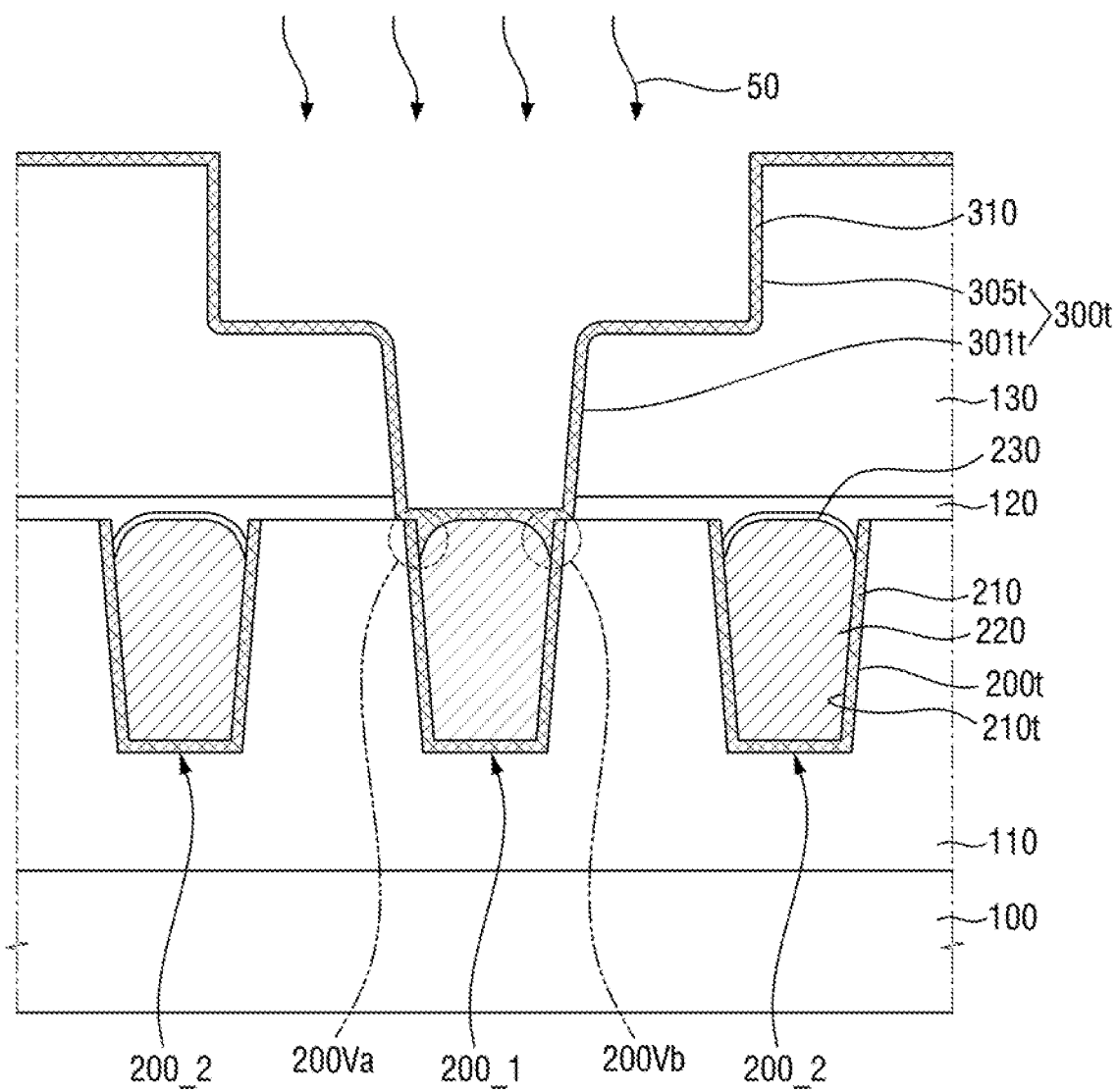

Referring to the exemplary embodiment of FIG. 28, the pre-upper barrier film 310p may be densified (e.g., increasing a density thereof) by a densification treatment process 50. As a result, the pre-upper barrier film 310p may form an upper barrier film 310.

For example, in an exemplary embodiment, physical vapor deposition (PVD) may be used for the densification treatment process 50. PVD, which uses a process gas, may improve the quality of the pre-upper barrier film 310p. For example, almost no additional barrier film may be formed on the pre-upper barrier film 310p by PVD. However, exemplary embodiments of the present inventive concepts are not limited thereto and the densification treatment process 50 may be performed by various different methods.

Figure 29:
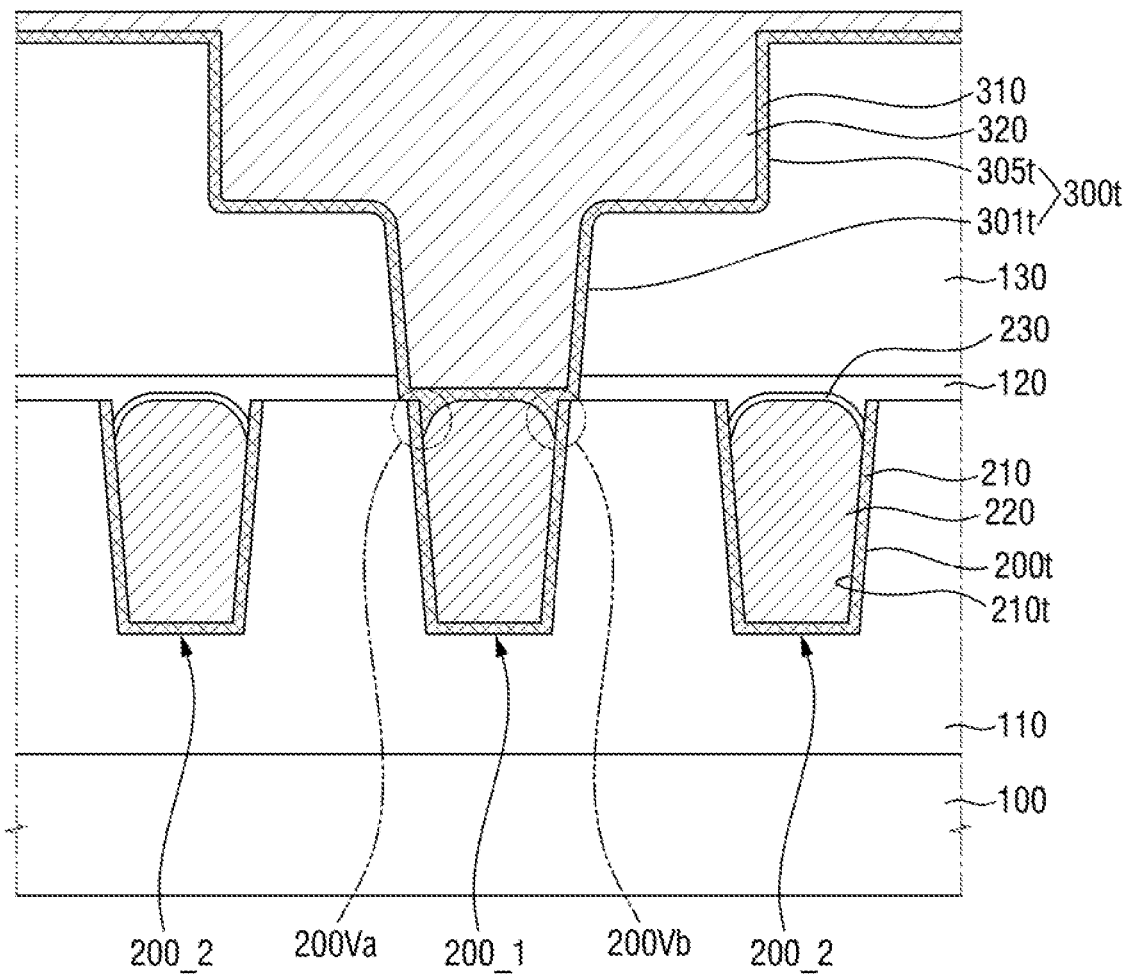

Referring to the exemplary embodiment of FIG. 29, an upper filling film 320, which fills the upper pattern trench 300t, may be formed on the upper barrier film 310.

In concluding the detailed description of exemplary embodiments of the present inventive concepts, those skilled in the art will appreciate that many variations and modifications may be made to the exemplary embodiments without substantially departing from the principles of the present inventive concepts. Therefore, the disclosed exemplary embodiments of the present inventive concepts are used in a generic and descriptive sense only and not for purposes of limitation.

What is claimed is:

1. A semiconductor device comprising:
   a first interlayer insulating film disposed on a substrate and including a first trench;
   a first lower conductive pattern filling the first trench and including first and second valley areas that are spaced apart from each other in a first direction parallel to an upper surface of the substrate, the first and second valley areas are recessed toward the substrate;
   a second interlayer insulating film disposed on the first interlayer insulating film and including a second trench that exposes at least a portion of the first lower conductive pattern; and
   an upper conductive pattern filling the second trench and including an upper barrier film and an upper filling film disposed on the upper barrier film,
   wherein the upper conductive pattern at least partially fills the first valley area.

2. The semiconductor device of claim 1, wherein the upper conductive pattern also at least partially fills the second valley area.

3. The semiconductor device of claim 2, wherein the upper barrier film entirely fills at least one of the first and second valley areas.

4. The semiconductor device of claim 2, wherein
   a top surface of the first lower conductive pattern includes first and second valley portions that define the first and second valley areas, respectively, and
   the upper barrier film extends along all surfaces of the first and second valley portions.

5. The semiconductor device of claim 2, wherein
   a top surface of the first lower conductive pattern includes first and second valley portions that define the first and second valley areas, respectively, and
   the upper barrier film extends along a partial portion of surfaces of the first and second valley portions.

6. The semiconductor device of claim 1, wherein a depth of the first valley area is the same as a depth of the second valley area.

7. The semiconductor device of claim 1, wherein
   the first lower conductive pattern includes a lower barrier film and a lower filling film that is disposed on the lower barrier film, and
   the first and second valley areas are defined by an upper surface of the lower filling film and portions of an upper surface of the lower barrier film that are not covered by the lower filling film.

8. The semiconductor device of claim 7, wherein
   the first lower conductive pattern further includes a lower liner disposed between the lower barrier film and the lower filling film, and
   bottom portions of the first and second valley areas are defined by the lower liner.

9. The semiconductor device of claim 1, wherein the second valley area filled with an insulating material.

10. The semiconductor device of claim 1, wherein the second valley area includes a wire void.

11. The semiconductor device of claim 1, further comprising:
a second lower conductive pattern disposed in the first interlayer insulating film and spaced apart from the first lower conductive pattern in the first direction,
wherein the second lower conductive pattern includes third and fourth valley areas that are spaced apart from each other in the first direction, and
wherein at least one of the third and fourth valley areas is filled with an insulating material.

12. The semiconductor device of claim 1, further comprising:
a second lower conductive pattern disposed in the first interlayer insulating film and spaced apart from the first lower conductive pattern in the first direction,
wherein the second lower conductive pattern includes third and fourth valley areas that are spaced apart from each other in the first direction, and
wherein at least one of the third and fourth valley areas includes a wire void.

13. A semiconductor device comprising:
a lower conductive pattern including a lower barrier film that forms a filling film trench, and a lower filling film disposed on the lower barrier film in the filling film trench, the lower conductive pattern having a top surface that has a first width in a first direction that is parallel to an upper surface of a substrate; and
an upper conductive pattern disposed on the lower conductive pattern, the upper conductive pattern is connected to the lower conductive pattern and includes an upper barrier film and an upper filling film that is disposed on the upper barrier film,
wherein a bottom surface of the upper conductive pattern has a second width in the first direction,
wherein the second width is greater than or equal to the first width, and
the upper barrier film directly covers portions of the lower barrier film that form inner sidewalls of the filling film trench.

14. The semiconductor device of claim 13, wherein
a top surface of the lower conductive pattern includes first and second valley portions, and
the first and second valley portions are defined by the lower filling film and the portions of the lower barrier film that are covered by the upper barrier film.

15. The semiconductor device of claim 14, wherein
the first valley portion defines a first valley area that extends in a second direction that crosses the first direction,
the second valley portion defines a second valley area that extends in the second direction, and
the first and second valley area are spaced apart from each other in the first direction.

16. The semiconductor device of claim 6, wherein
the lower conductive pattern further includes a lower liner that is disposed between the lower barrier film and the lower filling film, and
an uppermost portion of the lower liner is lower than uppermost portions of the lower barrier film and the lower filling film.

17. A semiconductor device comprising:
a first interlayer insulating film disposed on a substrate and including a first trench;
a lower conductive pattern disposed in the first trench and including a lower barrier film, a lower liner disposed on the lower barrier film, and a lower filling film disposed on the lower liner;
a second interlayer insulating film disposed on the first interlayer insulating film and including a second trench that exposes at least a portion of a top surface of the lower conductive pattern; and
an upper conductive pattern filling the second trench and including an upper barrier film and an upper filling film disposed on the upper barrier film,
wherein the lower conductive pattern further includes valley areas that are defined by the lower barrier film, the lower liner, and the lower filling film and extend in a thickness direction of the substrate, and
wherein the upper conductive pattern fills the valley areas.

18. The semiconductor device of claim 17, wherein a width of the top surface of the lower conductive pattern is less than or equal to a width of a bottom surface of the upper conductive pattern.

19. The semiconductor device of claim 17, wherein a lowermost portion of the upper filling film is higher than uppermost portion of the lower barrier film.

20. The semiconductor device of claim 17, wherein
the lower barrier film includes tantalum,
the lower liner includes cobalt, and
the lower filling film includes copper.

* * * * *